United States Patent
Gupta et al.

(10) Patent No.: US 6,352,917 B1
(45) Date of Patent: Mar. 5, 2002

(54) REVERSED DAMASCENE PROCESS FOR MULTIPLE LEVEL METAL INTERCONNECTS

(75) Inventors: Subhash Gupta; Mei-Sheng Zhou; Simon Chooi; Sangki Hong, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/598,691

(22) Filed: Jun. 21, 2000

(51) Int. Cl.[7] .......................... H01L 21/4763
(52) U.S. Cl. ................... 438/622; 438/633; 438/638; 438/639
(58) Field of Search .................. 438/622, 687, 438/638, 653, 624, 639, 633

(56) References Cited

U.S. PATENT DOCUMENTS

| | | | |
|---|---|---|---|
| 5,512,514 A | 4/1996 | Lee | 437/195 |
| 5,691,238 A | 11/1997 | Avanzino et al. | 437/195 |
| 5,693,568 A | 12/1997 | Liu et al. | 437/195 |
| 5,773,365 A * | 6/1998 | Ito | |
| 5,882,996 A | 3/1999 | Dai | 438/597 |
| 5,926,732 A | 7/1999 | Matsuura | 438/622 |
| 5,960,254 A * | 9/1999 | Cronin | |
| 5,969,422 A * | 10/1999 | Ting et al. | |
| 6,184,138 B1 * | 2/2001 | Ho et al. | |

* cited by examiner

Primary Examiner—Caridad Everhart
(74) Attorney, Agent, or Firm—George O. Saile; Rosemary L. S. Pike

(57) ABSTRACT

A new method of forming metal interconnect levels containing damascene interconnects and via plugs in the manufacture of an integrated circuit device has been achieved. The method creates a reversed dual damascene structure. A first dielectric layer is provided overlying a semiconductor substrate. The dielectric layer is patterned to form trenches for planned damascene interconnects. Insulating spacers may optionally be formed on the trench sidewalls. A conductive barrier layer is deposited overlying the dielectric layer and lining the trenches. A metal layer, preferably comprising copper, is deposited overlying the conductive barrier layer and filling the trenches. The metal layer and the conductive barrier layer are polished down to thereby form the damascene interconnects. A passivation layer may optionally be deposited. The damascene interconnects are patterned to form via plugs overlying the damascene interconnects. The patterning comprises partially etching down the damascene interconnects using a via mask overlying and protecting portions of the damascene interconnects. A trench mask also overlies and protects the first dielectric layer from metal contamination during the etching down.

34 Claims, 31 Drawing Sheets

REVERSED DAMASCENE PROCESS FOR MULTIPLE LEVEL METAL INTERCONNECTS

BACKGROUND OF THE INVENTION (1) Field of the Invention

The invention relates to a method of fabricating semiconductor structures, and more particularly, to a method of forming reversed damascene metal interconnects in the manufacture of integrated circuit devices.

(2) Description of the Prior Art

Damascene technology is an important capability in the present art of semiconductor manufacturing. Damascene and dual damascene schemes facilitates the use of copper for interconnects. Copper offers significant advantages due to its low resistivity when compared to aluminum.

Referring now to FIG. 1, a prior art dual damascene structure is illustrated. In this cross-sectional representation, three interconnect levels are shown. A substrate 10 contains via plugs 18 that connect, for example, to an underlying transistor junction (not shown).

The formation of the single damascene first level interconnect layer is as follows. The intermetal dielectric (IMD) layer is formed first. The first IMD etch stop layer 14 overlies the substrate 10. The first IMD dielectric layer 22 is deposited overlying the first etch stop layer 14 and the via plugs 18. The first IMD dielectric layer 22 is then etched to form trenches. A first level conductive barrier layer 28 is deposited to line the trenches. A first level copper layer 26 is deposited to fill the trenches. The first level copper layer 26 and the first level conductive barrier layer 28 are then polished down. Finally, a first level capping or passivation layer 30 is deposited overlying the first level copper layer 26 to complete the first level interconnect layer. This first level is created in a typical single damascene approach where a single level trench is etched and filled with metal to form a single interconnecting structure (the interconnect trace).

The second and third metalization layers are formed using a typical dual damascene approach. In a dual damascene approach, a two-level trench is etched and then filled with a single metal layer to form two interconnecting structures (both the interconnect line and the via). The second intermetal dielectric (IMD) is formed first. In this example, the second IMD comprises a dielectric stack consisting of the second IMD lower dielectric layer 34, the second IMD etch stop layer 38, and the second IMD upper dielectric layer 42. The trenches are etched in two steps. The second IMD etch stop layer 38 facilitates etching two-level trenches. The lower level of the trenches will form the vias to connect the second interconnect level to the first interconnect level. The upper level of the trenches will form the second level interconnect lines. After trench formation, the second level conductive barrier layer 48 and the second level copper layer 46, 50, 54 are deposited. A polish down is used to define the interconnections. A second level capping or passivation layer 58 is deposited to finish the second level. Note the two levels of the dual damascene structure. The lower level 50 is the via. The upper level 54 is the interconnect line. The third interconnect level is formed using the same method as used for the second level.

Several problems exist in the prior art dual damascene interconnect method. First, it is difficult to deposit the conductive barrier layer. For example, the third level conductive barrier layer 76 must be deposited in the dual damascene trench for the third level. A seed layer of copper is deposited after the barrier layer to catalyze the copper deposition. Insufficient barrier layer step coverage along the sidewall 101 and at the bottom 105 can occur due to the high aspect ratio of the trench in the via level. The insufficient coverage, that may result in voids, can cause copper deposition and diffusion problems. The second problem in the prior art is copper layer voids. For example, voids may occur during the deposition of the third level copper layer 86, 82. Again, the very high aspect ratio of the via level of the trench can cause this problem.

The third problem is that the two-level trenches require the use of many etch stop layers 103. For example, the third level etch stop layer 66 is used to facilitate the definition of upper and lower trench levels for the third level trenches. In addition, the third level capping or passivation layer 74 is likewise an etch stop layer. These etch stop layers 103 typically comprise silicon nitride that has a relatively high dielectric constant. The use of these etch stop layers 103 adds significantly to the parasitic capacitance of each interconnect level and reduces circuit performance. Finally, the fourth problem is that the via can misalign 104 to the underlying metal interconnect. Such misalignments increase the via resistance and degrade circuit performance.

Several prior art approaches disclose methods to form interconnecting layers. U.S. Pat. No. 5,693,568 to Liu et al discloses a process to form interconnect layers in an integrated circuit device. Interconnect lines and vias are formed for each interconnect level. A composite metal layer is deposited comprising three layers: an upper metal layer, an etch stop layer, and a lower metal layer. The composite metal layer is first etched through. A first dielectric layer is then deposited to fill the spaces between the etched composite metal. The upper metal layer is etched down to the etch stop layer to pattern the vias. A second dielectric layer is then deposited to fill gaps caused by the second etching. This method reverses the order of the vias and interconnects compared to the prior art though it is not a damascene process since the metal is patterned only by etching. U.S. Pat. No. 5,512,514 to Lee teaches a process to form interconnect levels. No barrier metal is used underlying the metal layer. The metal layer is etched twice. The first etch is partially through the copper and defines via plugs. The second etch is completely through the metal layer and defines the interconnect pattern. No non-conductive barrier layer is applied overlying the patterned metal layer. After both etch steps, a dielectric layer is deposited to isolate the level. This process also reverses the typical order of the via and the interconnect. This process is likewise not a damascene process since both via and interconnect lines are formed by etching and not by trench filling. U.S. Pat. No. 5,926,732 to Matsuura discloses a dual damascene process. In this method, the vias are formed below the interconnects as in the prior art example. An etch stop layer is used to stop the via level trench etch from penetrating to the previous level dielectric layer. U.S. Pat. No. 5,691,238 to Avanzino et al discloses a subtractive dual damascene approach. The via mask extends perpendicularly across the width of the interconnect pattern to allow a self-aligned etch. Aluminum is used for the metalization. U.S. Pat. No. 5,882,996 to Dai discloses a self-aligned dual damascene process.

SUMMARY OF THE INVENTION

A principal object of the present invention is to provide an effective and very manufacturable method to form metal interconnect levels in the manufacture of integrated circuits.

A further object of the present invention is to provide a method to form metal interconnect levels by using a reversed damascene process whereby via plugs are formed overlying and from the same metal layer as the conductive lines.

A still further object of the present invention is to form metal interconnect levels whereby the conductive lines are produced by etching trenches into a dielectric layer and then depositing metal to fill the trenches.

Another still further object of the present invention is to form via plugs by partially etching the metal layer.

Another still further object of the present invention is to simplify barrier layer lining deposition.

Another still further object of the present invention is to provide a method to simplify metal layer deposition.

Another still further object of the present invention is to eliminate one etch stop layer for each level.

Another still further object of the present invention is to eliminate via-to-underlying conductive line misalignment.

Another further object of the present invention is to prevent metal contamination of the dielectric layer during metal etching through the use of insulating sidewall spacers.

Another further object of the present invention is to prevent metal contamination of the dielectric layer during metal etching through the use of a passivation layer.

A yet further object of the present invention is to prevent metal contamination of the dielectric layer during metal etching through the use of a passivation layer as an etching mask.

In accordance with the objects of this invention, a new method of forming metal interconnect levels containing damascene interconnect lines and via plugs in the manufacture of an integrated circuit device has been achieved. A first dielectric layer, that may comprise a stack of dielectric materials, is provided overlying a semiconductor substrate. The dielectric layer is patterned to form trenches for planned damascene interconnects. A conductive barrier layer is deposited overlying the dielectric layer and lining the trenches. A metal layer, preferably comprising copper, is deposited overlying the conductive barrier layer and filling the trenches. The metal layer and the conductive barrier layer are polished down to confine the metal layer and the conductive barrier layer to the trenches and to thereby form the damascene interconnects. The damascene interconnects are patterned to form via plugs overlying conductive lines. The patterning comprises partially etching down the damascene interconnects using a via mask overlying and protecting portions of the damascene interconnects. A trench mask also overlies and protects the first dielectric layer from metal contamination during the etching down. A non-conductive barrier layer is deposited overlying the via plugs and the conductive lines to prevent metal out-diffusion and to complete the metal interconnect level.

Also in accordance with the objects of this invention, a new method of forming metal interconnect levels containing damascene interconnect lines and via plugs in the manufacture of an integrated circuit device has been achieved. A first dielectric layer, that may comprise a stack of dielectric materials, is provided overlying a semiconductor substrate. The dielectric layer is patterned to form trenches for planned damascene interconnects. An insulating layer is deposited overlying the dielectric layer and lining the trenches. The insulating layer is anisotropically etched to form insulating layer spacers on the sidewalls of the trenches. A conductive barrier layer is deposited overlying the dielectric layer, the insulating layer spacers, and lining the trenches. A metal layer, preferably comprising copper, is deposited overlying the conductive barrier layer and filling the trenches. The metal layer and the conductive barrier layer are polished down to confine the metal layer and the conductive barrier layer to the trenches and to thereby form the damascene interconnects. The damascene interconnects are patterned to form via plugs overlying conductive lines. The patterning comprises partially etching down the damascene interconnects using a via mask overlying and protecting portions of the damascene interconnects. The presence of the insulating layer sidewall spacers further prevent metal layer out-diffusion during the patterning of the damascene interconnects. A trench mask also overlies and protects the first dielectric layer from metal contamination during the etching down. A non-conductive barrier layer is deposited overlying the via plugs and the conductive lines to prevent metal out-diffusion and to complete the metal interconnect level.

Also in accordance with the objects of this invention, a new method of forming metal interconnect levels containing damascene interconnect lines and via plugs in the manufacture of an integrated circuit device has been achieved. A first dielectric layer, that may comprise a stack of dielectric materials, is provided overlying a semiconductor substrate. The dielectric layer is patterned to form trenches for planned damascene interconnects. A conductive barrier layer is deposited overlying the dielectric layer and lining the trenches. A metal layer, preferably comprising copper, is deposited overlying the conductive barrier layer and filling the trenches. The metal layer and the conductive barrier layer are polished down to confine the metal layer and the conductive barrier layer to the trenches and to thereby form the damascene interconnects. A passivation layer is deposited overlying the dielectric layer and the damascene interconnects. The passivation layer and the damascene interconnects are patterned to form via plugs overlying conductive lines. The patterning comprises partially etching down the damascene interconnects using a via mask overlying and protecting portions of the damascene interconnects. A trench mask also overlies and protects the first dielectric layer from metal contamination during the etching down. A non-conductive barrier layer is deposited overlying the via plugs and the conductive lines to prevent metal out-diffusion and to complete the metal interconnect level.

Also in accordance with the objects of this invention, a new method of forming metal interconnect levels containing damascene interconnect lines and via plugs in the manufacture of an integrated circuit device has been achieved. A first dielectric layer, that may comprise a stack of dielectric materials, is provided overlying a semiconductor substrate. The dielectric layer is patterned to form trenches for planned damascene interconnects. A conductive barrier layer is deposited overlying the dielectric layer and lining the trenches. A metal layer, preferably comprising copper, is deposited overlying the conductive barrier layer and filling the trenches. The metal layer and the conductive barrier layer are polished down to confine the metal layer and the conductive barrier layer to the trenches and to thereby form the damascene interconnects. A passivation layer is deposited overlying the dielectric layer and the damascene interconnects. The passivation layer is patterned to form a hard mask for the damascene interconnects. The damascene interconnects are patterned using the passivation layer hard mask to form via plugs overlying conductive lines. The patterning comprises partially etching down the damascene interconnects using a via mask overlying and protecting portions of the damascene interconnects. A trench mask also overlies and protects the first dielectric layer from metal contamination during the etching down. A non-conductive barrier layer is deposited overlying the via plugs and the conductive lines to prevent metal out-diffusion and to complete the metal interconnect level.

BRIEF DESCRIPTION OF THE DRAWINGS

In the accompanying drawings forming a material part of this description, there is shown.

DESCRIPTION OF THE PREFERRED EMBODIMENTS

The embodiments disclose the application of the present invention to the formation of reversed damascene metal interconnects in the manufacture of integrated circuit devices. It should be clear to those experienced in the art that the present invention can be applied and extended without deviating from the scope of the present invention.

Figure 1:
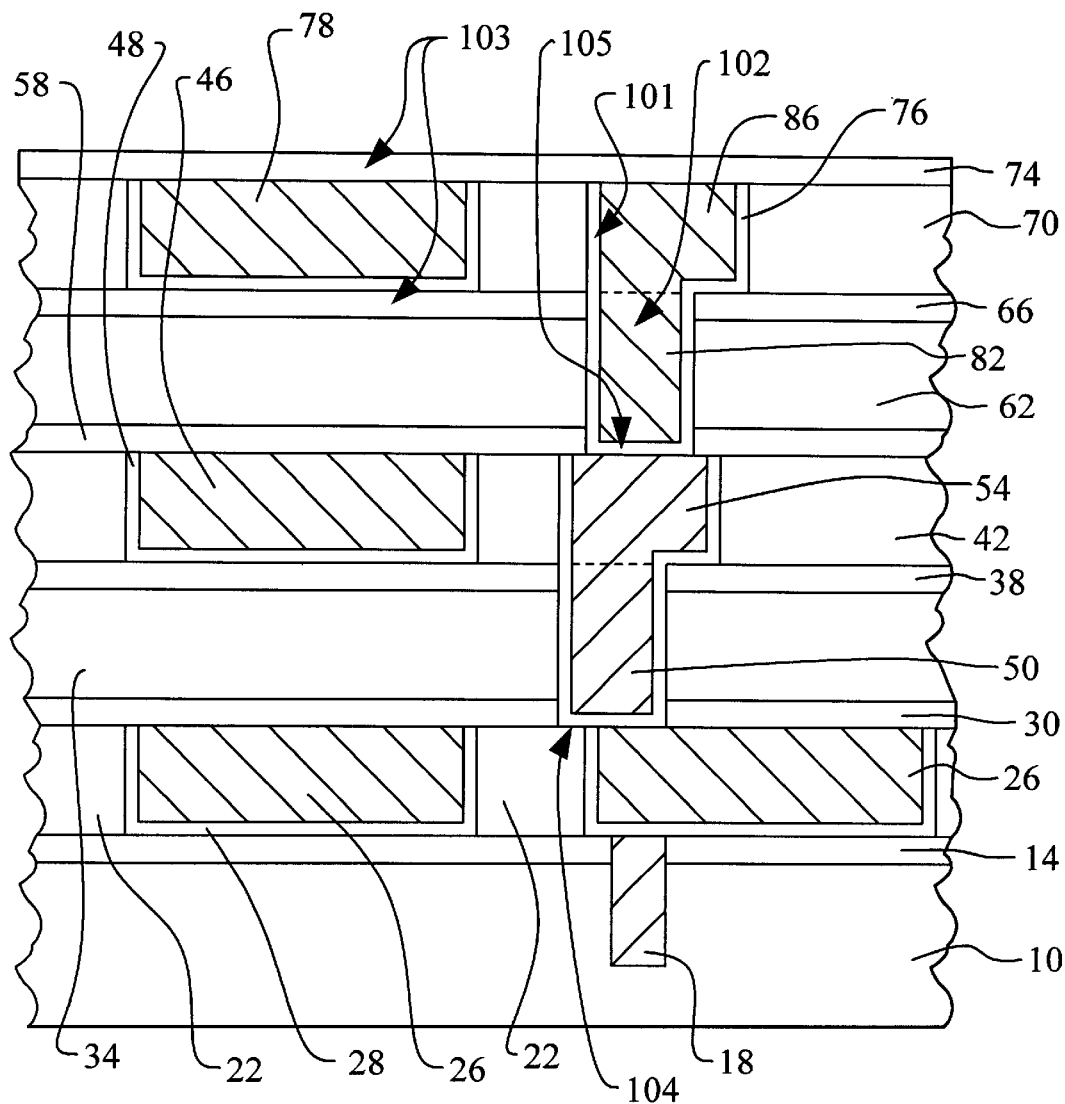
FIG. 1 schematically illustrates in cross-section a partially completed prior art integrated circuit device.
Figure 2:
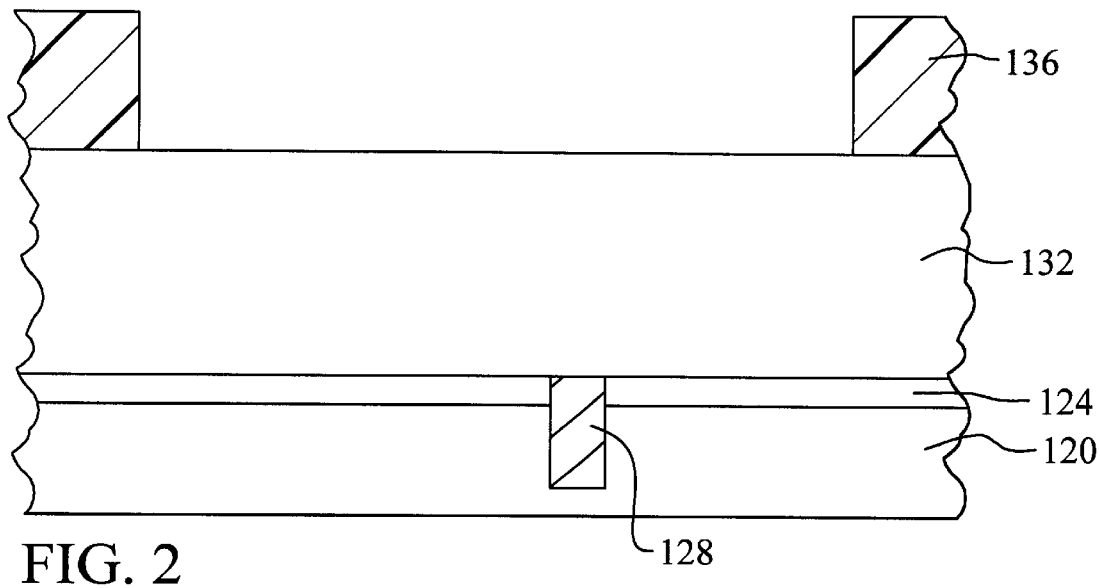
FIGS. 2 through 13 schematically illustrate in cross-sectional representation a first preferred embodiment of the present invention.

Referring now particularly to FIG. 2, there is shown a cross-sectional representation of the first preferred embodiment of the present invention. In FIGS. 2 through 7, the method of formation of a first level of interconnect will be illustrated. In FIGS. 8 through 13, additional levels of interconnect are added to show a more complete integration of the device.

A semiconductor substrate 120 is illustrated. The semiconductor substrate 120 may comprise layers and devices formed prior to the deposition of the first dielectric layer. However, for simplification of the illustration, the semiconductor substrate 120 is illustrated as a single layer.

An etch stop layer 124 has been deposited overlying the semiconductor substrate 120. The purpose of the etch stop layer 124 is to prevent the subsequent trench etch from damaging the semiconductor substrate 120. The etch stop layer 124 preferably comprises silicon nitride deposited by chemical vapor deposition (CVD) to a thickness of between about 100 Angstroms and 5,000 Angstroms. A contact plug 128 is formed in the semiconductor substrate 120 as part of a completed interconnection metalization (not shown). The contact plug 128 may comprise a via plug. The details of the construction of the contact plug 128 are not important to the specifics of the first preferred embodiments of the present invention. For example, the contact plug 128 may comprise tungsten deposited into a pre-etched trench and polished down.

A first dielectric layer 132 is deposited overlying the etch stop layer 124 and the contact plug 128. The first dielectric layer 132 may comprise a stack of dielectric materials. It is preferred that the first dielectric layer 132 comprises one of the group of: undoped silicon dioxide (SiO2); fluorine-doped silicon dioxide, such as fluorosilicate glass (FSG); phosphorus-doped silicon dioxide; boron-doped silicon dioxide; phosphorus and boron-doped silicon dioxide; carbon-doped silicon dioxide, such as alkyl silsesquioxane, aryl silsesquioxane, and alkyl-aryl silsesquioxane; organic polymers, such as Teflon and polyimide; hydrogen-doped silicon dioxide, such as hydrogen silsesquioxane; and porous moieties, or combinations, of any of the above mentioned materials.

The thickness of the first dielectric layer 132 is important because, as will be demonstrated, this will determine the thickness of the combined damascene interconnect and via structure. In this preferred embodiment, the first dielectric layer 132 is deposited to a thickness of between about 4,000 Angstroms and 20,000 Angstroms.

The first dielectric layer 132 is patterned using a photolithographic sequence common in the art. A photoresist layer 136 is applied to the surface of the first dielectric layer 132. The photoresist layer 136 is patterned by exposure to actinic light through what may be termed the trench mask. After development, the photoresist layer 136 exposes portions of the first dielectric layer 132 as shown.

Figure 3:
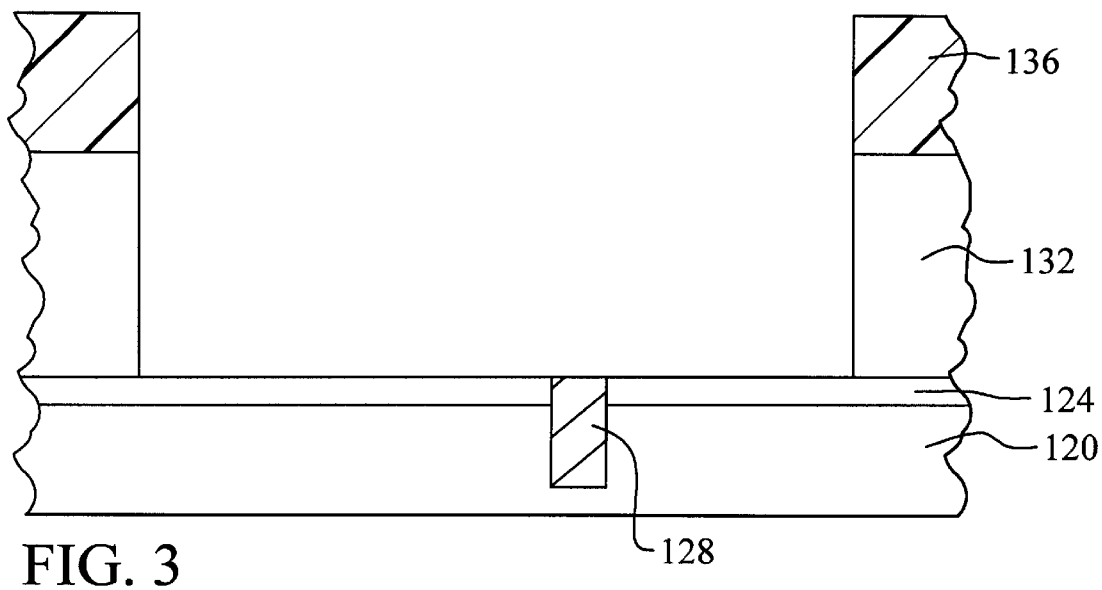

Referring now to FIG. 3, an important feature of the present invention is shown. The first dielectric layer 132 is patterned by anisotropic etching to form trenches for planned damascene interconnects. Note that patterning exposes the contact plugs 128. Note also that the etch stop layer 124 prevents the etching process from damaging the underlying semiconductor substrate 120. A conventional plasma-assisted dry etch is used in this step. Following the patterning of the first dielectric layer 132, the remaining photoresist layer 136 is stripped.

The trench patterned into the first dielectric layer 132 is much wider at the base than that of the prior art. This is due to the fact that the prior art trench is designed to form the via connection between metal layers whereas the trench of the present invention can be made as wide as the metal interconnects.

Figure 4:
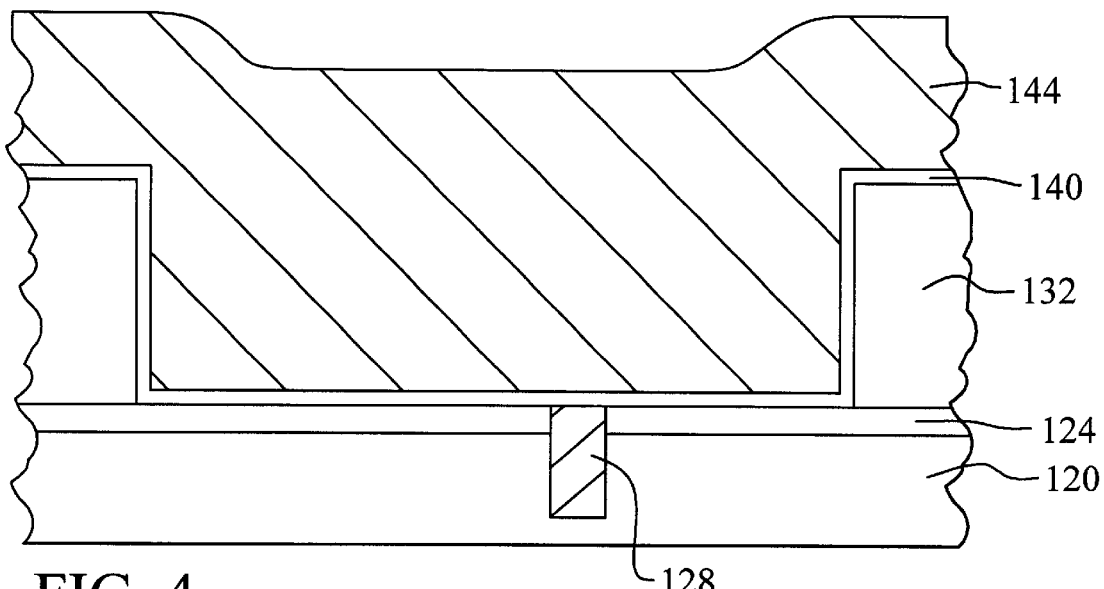

Referring now to FIG. 4, another important feature of the present invention illustrated. A conductive barrier layer 140 is deposited overlying the first dielectric layer 132 and lining the trench. The conductive barrier layer 140 may fulfill three purposes in the present invention. First, the conductive barrier layer 140 prevents ionic out-diffusion of metal if the subsequently deposited metal layer 144 comprises copper. Second, the conductor barrier layer 140 provides a conductive interface between the contact plug 128 and the metal layer 144. Third, the conductive barrier layer 140 may serve as a seed or catalyst layer for electroless plating of copper. Note that the conductive barrier layer 140 is very thinly deposited as in the prior art. However, the relatively large width of the trench facilitates the deposition of a thin conductive barrier layer 140 without creating voids. The conductive barrier layer 140 comprises one or more materials from the group of: titanium, titanium nitride, tantalum, tantalum nitride, tungsten nitride, ternary metal-silicon-nitride (WSi$_x$N$_y$), and ternary metal-boron-nitride (WB$_x$N$_y$). Tungsten nitride is especially suited as a seed layer for electroless plating of copper. The conductive barrier layer 140 is preferably deposited to a thickness of between about 500 Angstroms and 5,000 Angstroms.

A metal layer 144 is deposited overlying the conductive barrier layer 140 and filling the trenches, as shown in FIG. 4. The metal layer 144 may comprise copper, a copper alloy, aluminum, or an aluminum alloy. Preferably, the metal layer 144 comprises copper that has been deposited by one or more of the following processes: physical vapor deposition (PVD), electroless plating, and chemical vapor deposition (CVD). Subsequent annealing of the deposited copper in a furnace or in rapid thermal annealing (RTA) equipment at a temperature of between about 100 degrees C. and 400 degrees C. is performed. Note that the relatively large width of the trench allows the copper layer 144 to be deposited without creating voids.

Figure 5:
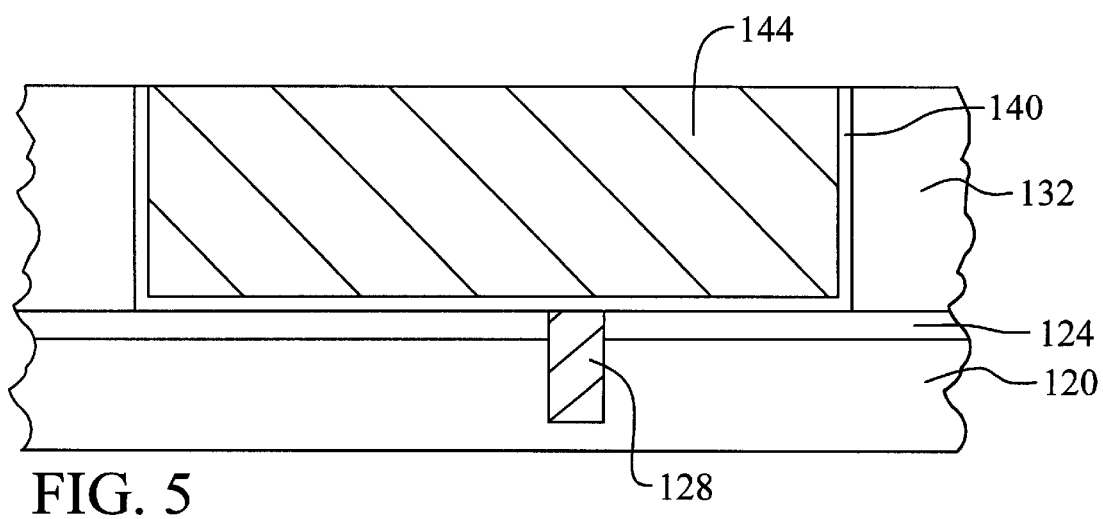

Referring now to FIG. 5, another important feature is described. The metal layer 144 and the conductive barrier layer 140 are polished down to confine the metal layer 144 and the conductive barrier layer 140 to the trenches and to thereby form the damascene interconnects. At this point in the process, the interconnect pattern for the interconnect level has been formed in the trenches and has been filled with the metal layer 144. Note that this means that it is the damascene interconnects 144 and not the vias for this level that connect downward to the contact plugs 128. Subsequently, the via for this level will be formed in the upper portion of the damascene interconnects 144 making this a reversed damascene process when compared to the typical prior art. Note also that the damascene interconnects 144 are truly formed by a damascene process comprising trench formation followed by metal inlay. Therefore, the entire thickness of the metal layer does not have to be etched in the interconnect formation process.

Figure 6:
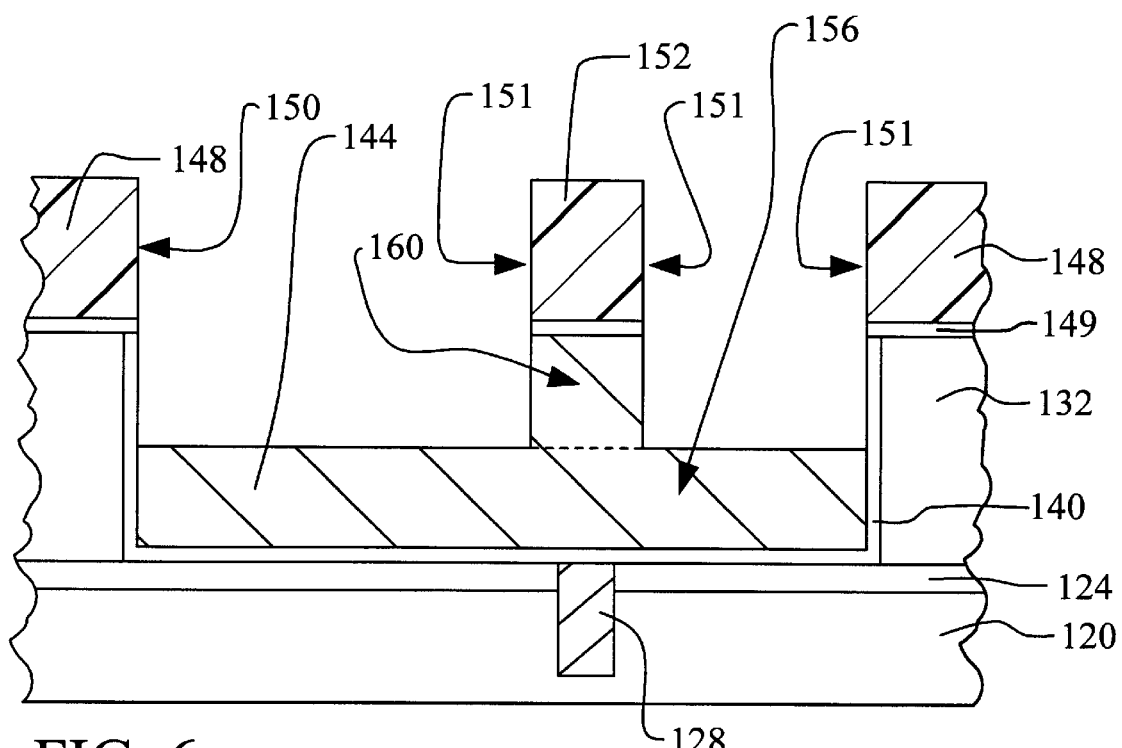

Referring now to FIG. 6, the damascene interconnects 144 are patterned to form via plugs 152. This patterning is done by a photolithographic process. An organic bottom anti-reflective coating (BARC) layer 149 is applied overlying the metal layer 144. The BARC layer 149 reduces the reflectivity of the metal layer 144 during the exposure step of the lithographic sequence. The BARC layer 149 comprises a commercially available material such as poly(arylsulfunate)-based material or polyacrylate-based material. It should be understood that the BARC layer 149 is an optional step that is included in the present invention as a typical process. A photoresist layer 148, 152 is applied overlying the BARC layer 149. The photoresist layer 148, 152 is exposed to actinic light through a mask that combines the data of the aforementioned trench mask (photoresist areas labeled 148) with data specific to the via plugs (photoresist areas labeled 152). After development, the photoresist layer 148, 152 remains overlying the first dielectric layer 132 and the damascene interconnects 144 while exposing a selected part of the damascene interconnects. The presence of the photoresist layer 148 overlying the first dielectric layer 132 protects the first dielectric layer 132 from metal diffusion, especially of copper, during the etching process.

Note that the patterned photoresist layer sections 148 and 152 may need to be oversized to insure that the first dielectric layer 132 is never exposed during the etching of the metal layer 144. For example, if an anisotropic dry etching process is used to etch the metal layer 144, then the patterned photoresist sections 148 should be oversized on the trench edge 150 by between about 0.01 microns and 0.5 microns to insure that the patterned photoresist 148 overlaps the conductive barrier layer 140 even under worst case alignment. If a wet etch is used, then the patterned photoresist sections 148 should be oversized on the trench edge 150 by between about 0.01 microns and 0.5 microns and the patterned photoresist section 152 overlying the via plugs 160 should be oversized 151 by between about 0.02 microns and 1.0 micron to compensate for alignment tolerance and for lateral etching that may occur. These concepts are also applicable for subsequent levels of damascene interconnects formed in the method of the present invention.

The patterning of the damascene interconnects 144 is accomplished by plasma-assisted dry etching or by wet etching. A wet etching selective to the metal layer 144 relative to the conductive barrier layer 140 is preferred. If a wet etch is used and the metal of the metal layer 140 is copper, the etching chemistry should comprise one or more of the group containing: dimethylsulfoxide (DMSO), carbon tetrachloride (CCl$_4$), acetic acid (CH$_3$COOH), NH$_4$F, hydrofluoric acid (HF), tetramethylammonium hydroxide (TMAH), tetraethylammonium hydroxide (TEAH), tetrapropylammonium hydroxide (TPAH), water, surfactant, and benzotriazole (BTA). Some preferred solutions include: DMSO and CCl$_4$, NH$_4$F and acetic acid, and HF, NH$_4$F, and water. If a plasma-assisted dry etch is used, the etching chemistry should comprise one or more of the group containing: Cl$_2$, BCl$_3$, N$_2$, and fluorocarbons.

The etching process is timed such that the damascene interconnects 144 are only partially etched down. After the etch, via plugs 160 have been formed in an upper portion of the damascene interconnects 144. The remaining lower portion may now be called the conductive lines 156. Note that the via plugs 160 are formed from the same metal layer 144 as the conductive lines 156. Therefore, there is no possibility of the via plugs 160 being misaligned to the conductive lines 156. Preferably, the via plugs are formed with a vertical thickness of between about 2,000 Angstroms and 10,000 Angstroms.

The presence of the conductive barrier layer 140 and the photoresist layer 148 overlying the first dielectric layer 132 prevents metal contamination, especially copper, into the first dielectric layer 132 during the etching process. Upon removal of the photoresist layer 148 and 152, an optional hydrogen plasma or ammonia plasma treatment may be performed to remove any copper oxide from the surface prior to the deposition of the next layer of film.

Figure 7:
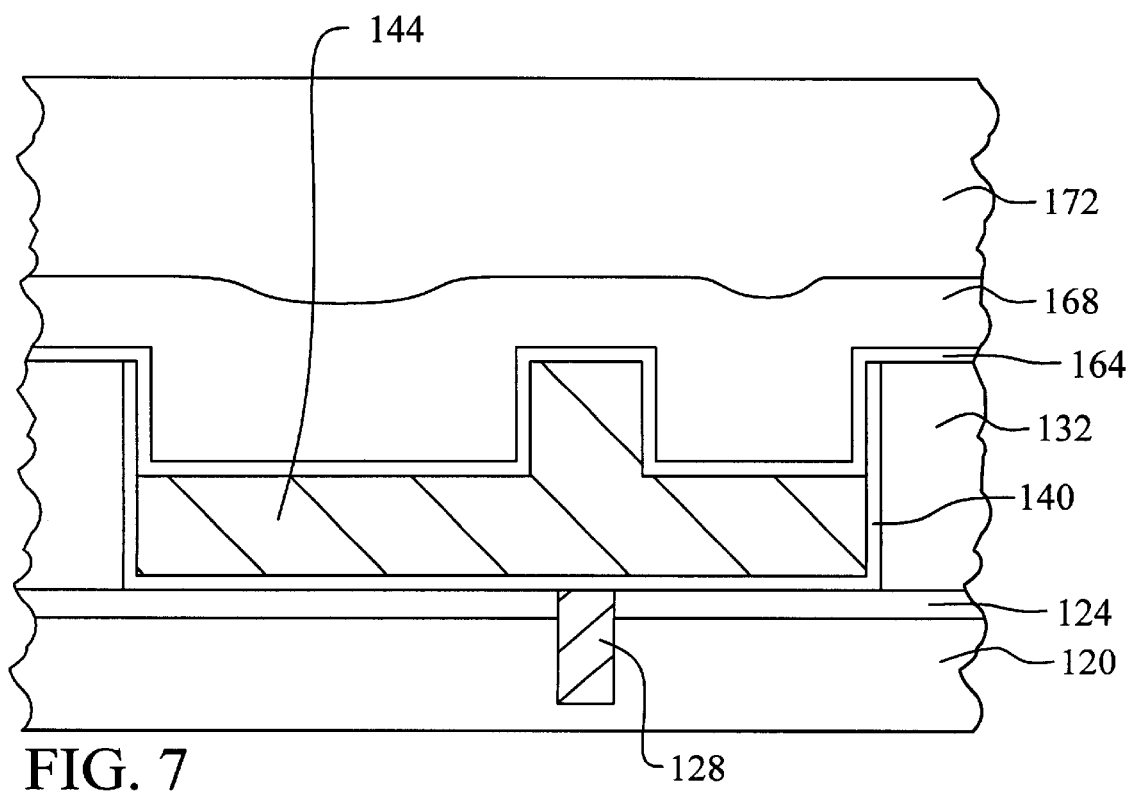

Referring now to FIG. 7, a non-conductive barrier layer 164 is deposited overlying the first dielectric layer 132, the conductive barrier layer 140, the via plugs and the conductive lines 144. There are two purposes for the non-conductive barrier layer 164. First, if copper is used for the metal layer, the non-conductive barrier layer 164 prevents copper ion diffusion into the overlying dielectric material. Second, the non-conductive barrier layer 164 can act as an etch stop during formation of trenches for the next level of interconnect. The non-conductive barrier layer 164 comprises one or more of the following materials: silicon nitride, Applied Material Corporation's BLok, silicon carbide, carbon nitride, boron nitride, carbon boron nitride, and silicon oxynitride. The non-conductive barrier layer 164 is preferably deposited to a thickness of between about 50 Angstroms and 5,000 Angstroms.

A second dielectric layer 168, 172 is deposited overlying the non-conductive barrier layer 164. The second dielectric layer 168, 172 may comprise a single dielectric material or a stack of dielectric materials. In this preferred embodiment, a gap filling dielectric layer 168, such as high density plasma (HDP) oxide or a spin-on organic polymer or hydrogen-doped silicon dioxide, is first deposited. A capping layer 172 of a silicon dioxide-type of material is then deposited. It is preferred that the second dielectric layer 168, 172 comprise one of the group of: undoped silicon dioxide (SiO2); fluorine-doped silicon dioxide, such as fluorosilicate glass (FSG); phosphorus-doped silicon dioxide; boron-doped silicon dioxide; phosphorus and boron-doped silicon dioxide; carbon-doped silicon dioxide, such as alkyl silsesquioxane, aryl silsesquioxane, and alkyl-aryl silsesquioxane; organic polymers, such as Teflon and polyimide; hydrogen-doped silicon dioxide, such as hydrogen silsesquioxane; and porous moieties, or combinations, of any of the above mentioned materials. The second dielectric layer 172 is then planarized to complete this first level of reversed damascene metal interconnects.

Figure 8:
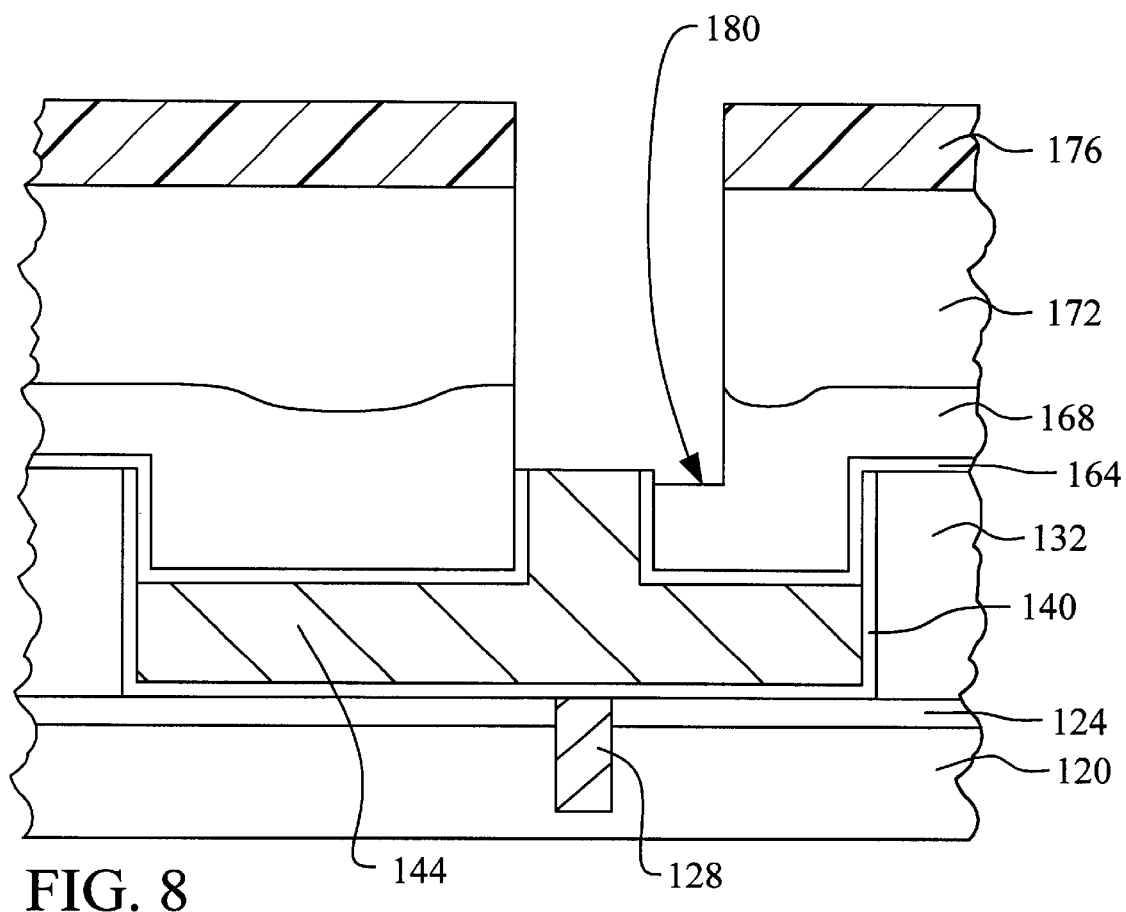

Referring now to FIG. 8, further processing steps are performed to create a second level of interconnection. A photoresist layer 176 is applied overlying the second inter-level dielectric layer 168, 172. This photoresist layer 176 is exposed and developed as in the first level process. The second dielectric layer 168, 172 is patterned to form trenches for the second-level damascene interconnects. Note that the non-conductive barrier layer 164 is etched through to expose the top of the via plug. In addition, note that some overetching 180 of the second interlevel dielectric layer 168, 172 may occur. The photoresist layer 176 may be removed by oxygen ashing. However, in the presence of exposed copper and, possibly, the organic material in the dielectric, the photoresist layer 176 is preferably removed using a solvent or a photoresist stripper.

Figure 9:
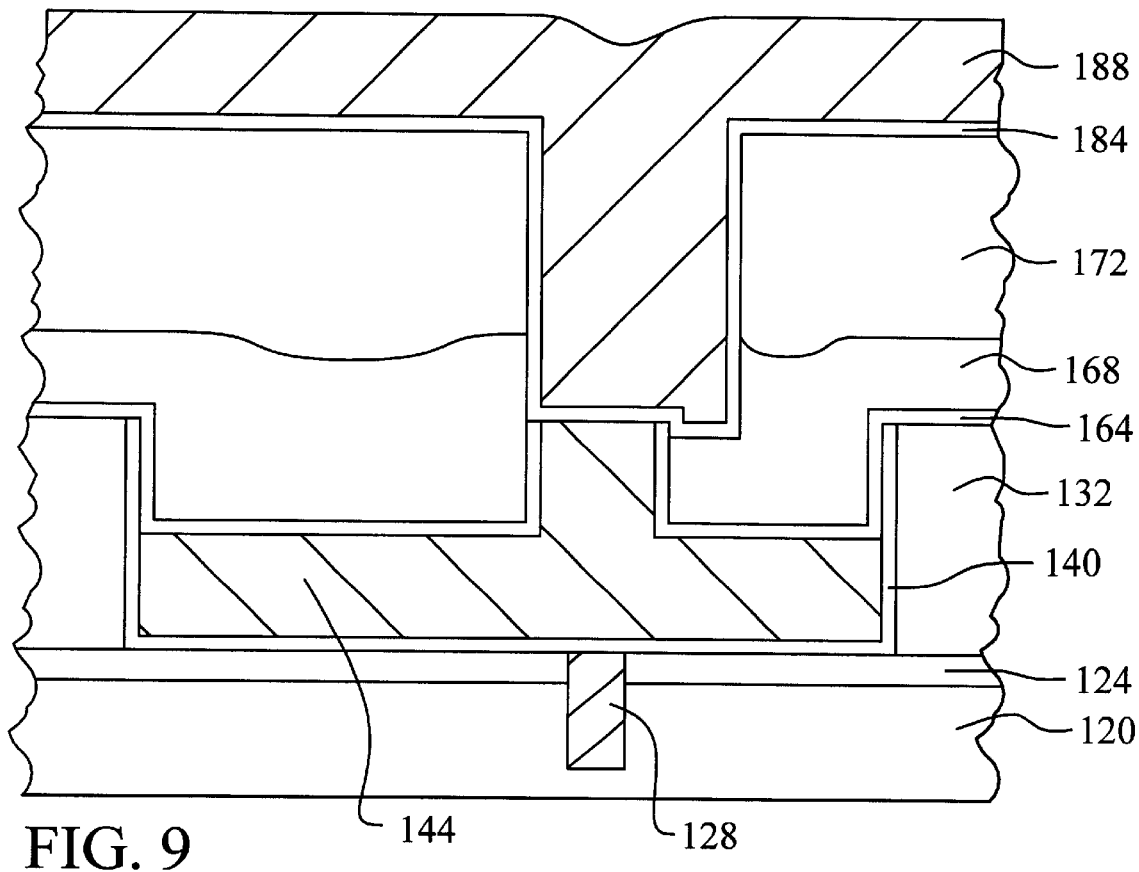

Referring now to FIG. 9, a second-level conductive barrier layer 184 is deposited overlying the second dielectric layer 168, 172 and lining the trenches. The second-level conductive barrier layer 184 serves the same purpose as the first-level conductive barrier layer 164 and comprises the same preferred materials. The relatively wide trench again facilitates the void free deposition of the second-level conductive barrier layer 184. The second-level metal layer 188 is deposited overlying the second-level conductive barrier layer 184 and filling the trenches. The second-level metal layer 188 also comprises the same materials as the first-level metal layer 144. Again, the preferred second-level metal layer 188 is copper.

Figure 10:
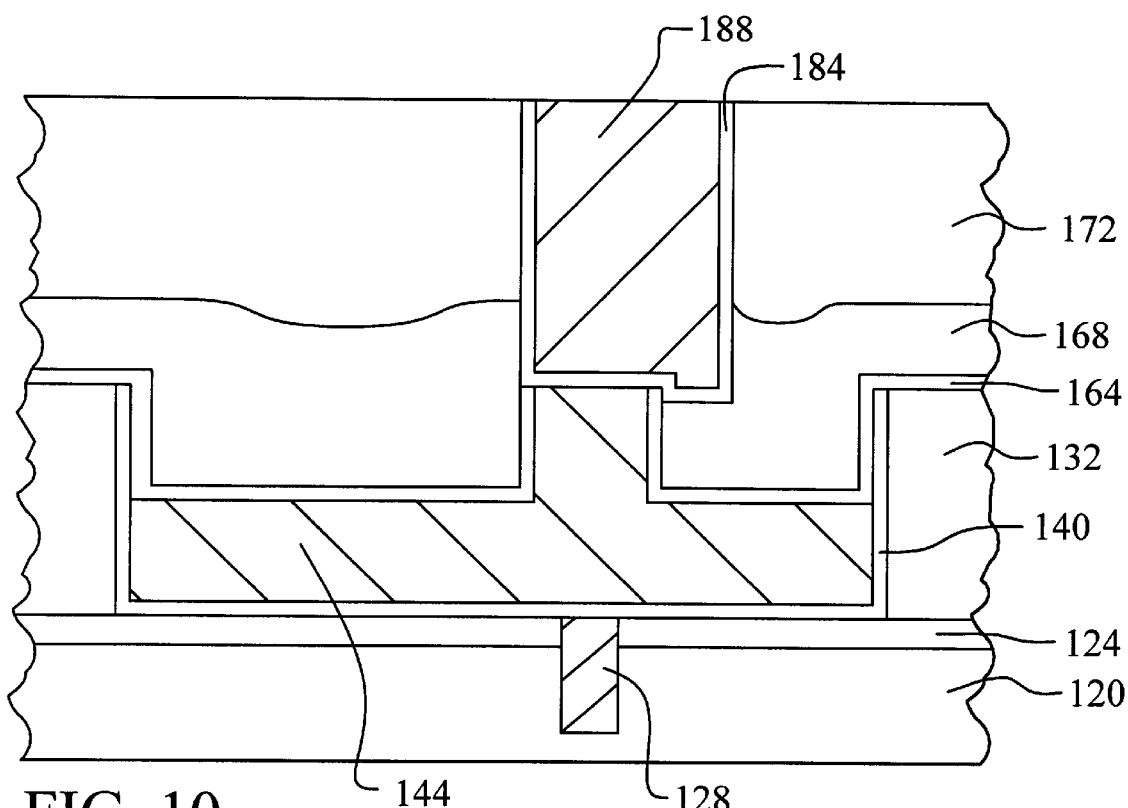

Referring now to FIG. 10, the second-level metal layer 188 and second-level conductive barrier layer 184 are polished down to confine the second-level metal layer 188 and second-level conductive barrier layer 184 to the trenches. The second-level damascene interconnect is thereby defined.

Figure 11:
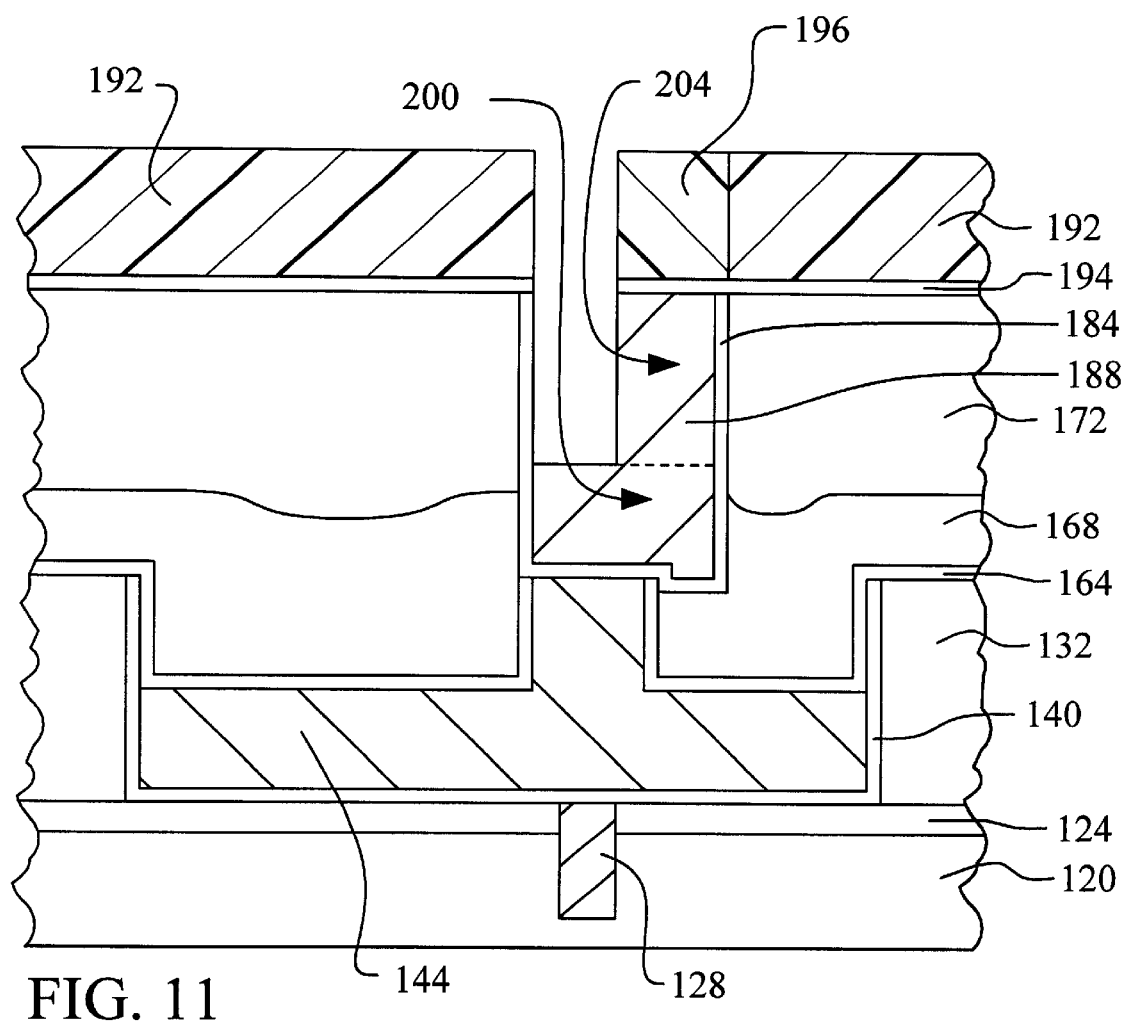

Referring now to FIG. 11, the damascene interconnects 188 are partially etched down to form both conductive lines 200 and via plugs 204 from the same metal layer 188. An organic bottom anti-reflective coating (BARC) layer 194 is applied overlying the metal layer 188. The BARC layer 194 reduces the reflectivity of the metal layer 188 during the exposure step of the lithographic sequence. The BARC layer 194 comprises a commercially available material such as poly(arylsulfunate)-based material or polyacrylate-based material. It should be understood that the BARC layer 194 is an optional step that is included in the present invention as a typical process. The photoresist layer 192, 196 is patterned using a mask combining the second-level trench mask used in FIG. 8 and a via specific mask. The photoresist protects the via plug (shown as photoresist layer label 196) and protects the second dielectric layer 168, 172 (shown as photoresist label 192). Note again that the presence of the photoresist layer 192 overlying the second dielectric layer 168, 172 prevents metal contamination during the etch.

Figure 12:
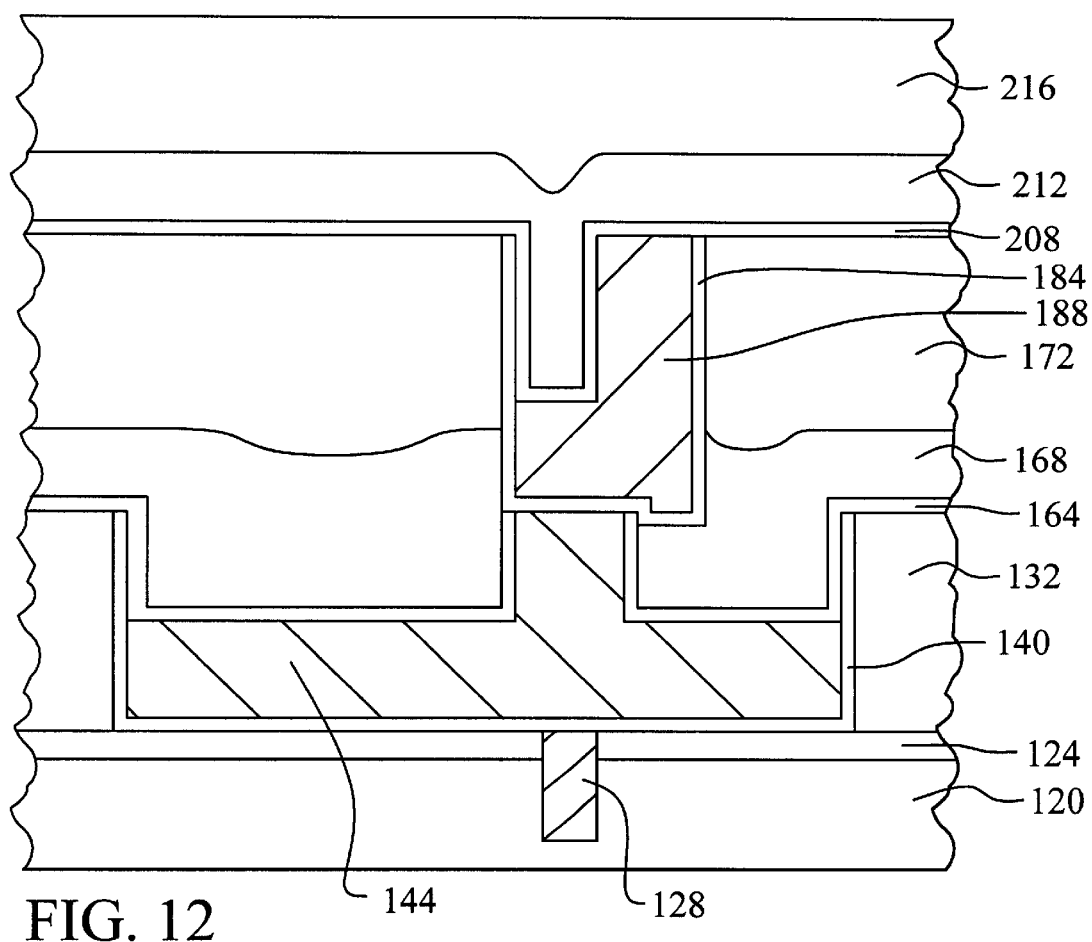

Referring now to FIG. 12, the second non-conductive barrier layer 208 is deposited overlying the second dielectric layer 168, 172 and the via plugs and conductive lines 188. The second non-conductive barrier layer 208 performs the same function as the non-conductive barrier layer used in the first-level interconnects and comprises the same preferred materials. A second-level second dielectric layer 212, 216 is deposited and planarized to complete the second-level reversed damascene interconnects. The second-level second dielectric layer 212, 216 may comprise a single dielectric material or a stack of two or more dielectric materials. As shown in FIG. 12, the preferred second-level second dielectric layer 212, 216 comprises two dielectric layers.

Figure 13:
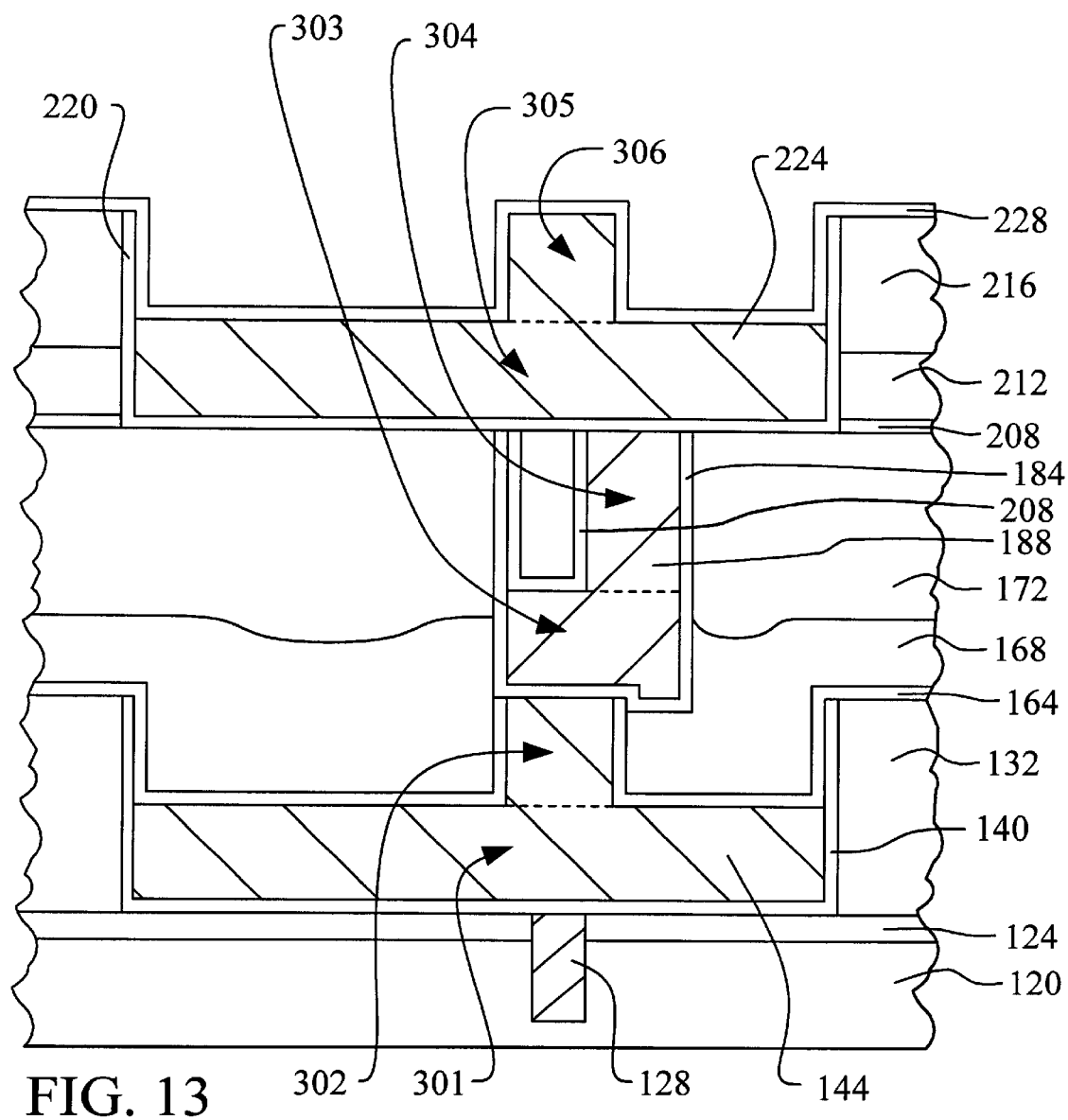

Referring now to FIG. 13, a third level of interconnection is added to the cross-section. Again, the same processing steps may be repeated. Each level illustrates the characteristics of this method. Conductive lines 301, 303, 305 are formed by damascene inlay in the lower structure of the level. Via plugs 302, 304, 306 are the upper structures of each level. They are formed by partially etching down the metal layers 144, 188, 224. The use of conductive barrier layers 140, 184, 220 and non-conductive barrier layers 164, 208, 228 facilitate the use of copper. The conductive barrier layers and the masking approach, especially covering the dielectric layers 132, 168, 172, 212, 216 to prevent metal contamination, likewise enables a copper process.

Now the specific advantages of the present invention compared to the prior art can be listed. First, the novel process simplifies the barrier layer deposition process. Second, the copper deposition process is simplified. Third, the process does not require the additional etch stop layer and therefore capacitive coupling is reduced. Fourth, since the via plugs are formed in the same metal layer as the underlying conductive lines, there is no misalignment.

Figure 14:
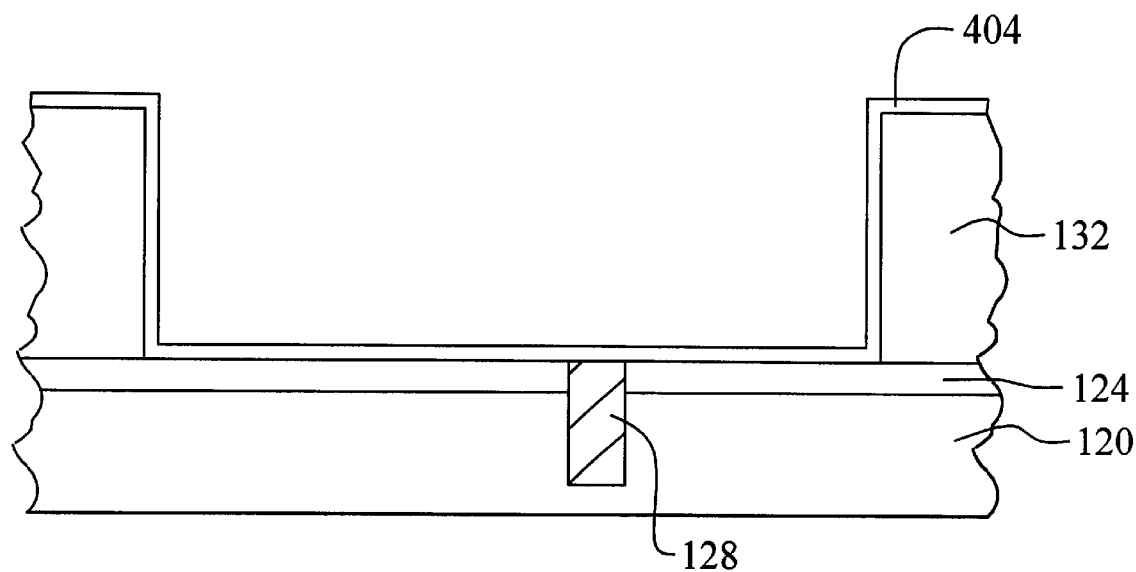
FIGS. 14 through 17 schematically illustrate in cross-sectional representation a second preferred embodiment of the present invention.

A second preferred embodiment of the present invention is now disclosed. An insulating layer spacer is herein incorporated into the present invention to enhance the process capability of metal layer etching into vias plugs and conductive lines for a first level of interconnect. Referring again to FIG. 3, the process of the first preferred embodiment is suspended after the first dielectric layer 132 is patterned to form trenches for planned damascene interconnects. Referring now particularly to FIG. 14, the second preferred embodiment initiates with the deposition of an insulating layer 404 overlying the first dielectric layer 132 and lining the trenches. The insulating layer 404 preferably comprises one of the group containing: silicon nitride, silicon oxynitride, BLok (from Applied Material Corporation), silicon carbide, carbon nitride, and boron nitride. The insulating layer 404 is deposited to a thickness of between about 500 Angstroms and 5,000 Angstroms using a conventional deposition process.

Figure 15:
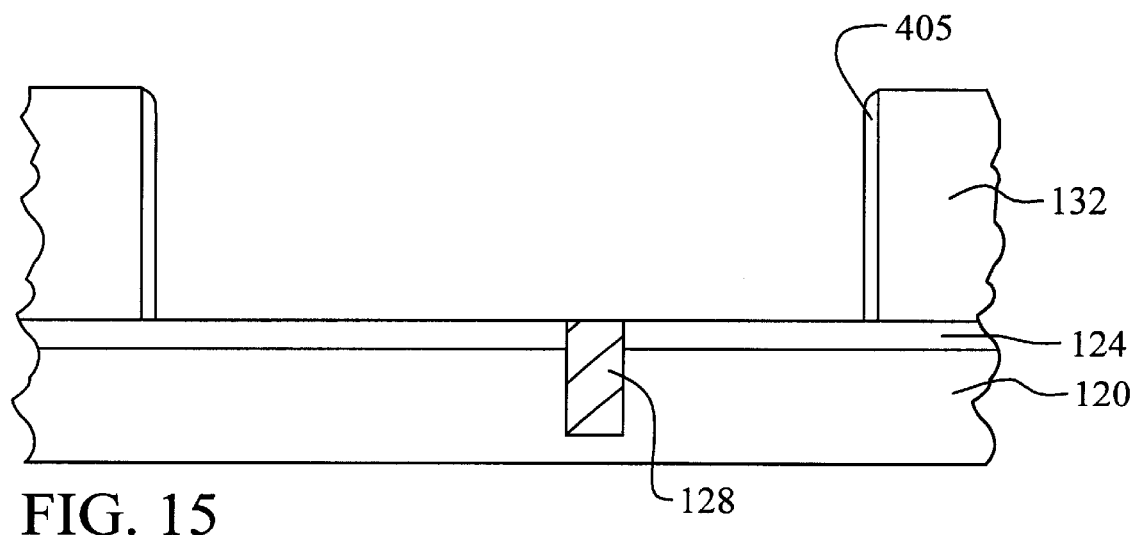

Referring now to FIG. 15, the insulating layer 404 is anisotropically etched to form insulation layer spacers 405 on the sidewalls of the trenches. The anisotropic etching is performed preferably by a plasma-assisted dry etching comprising an etching chemistry of one or more of the following gases: fluorocarbon, fluorine-substituted hydrocarbon, fluorine, chlorine, hydrocarbon, nitrogen, hydrogen, BCl$_3$, oxygen, and argon.

Figure 16:
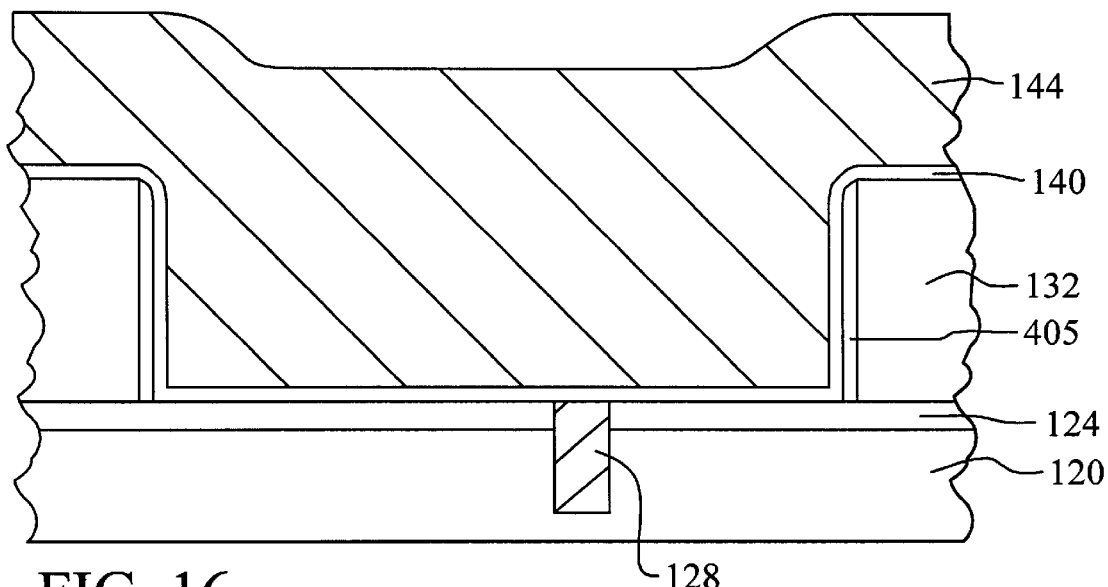
Figure 17:
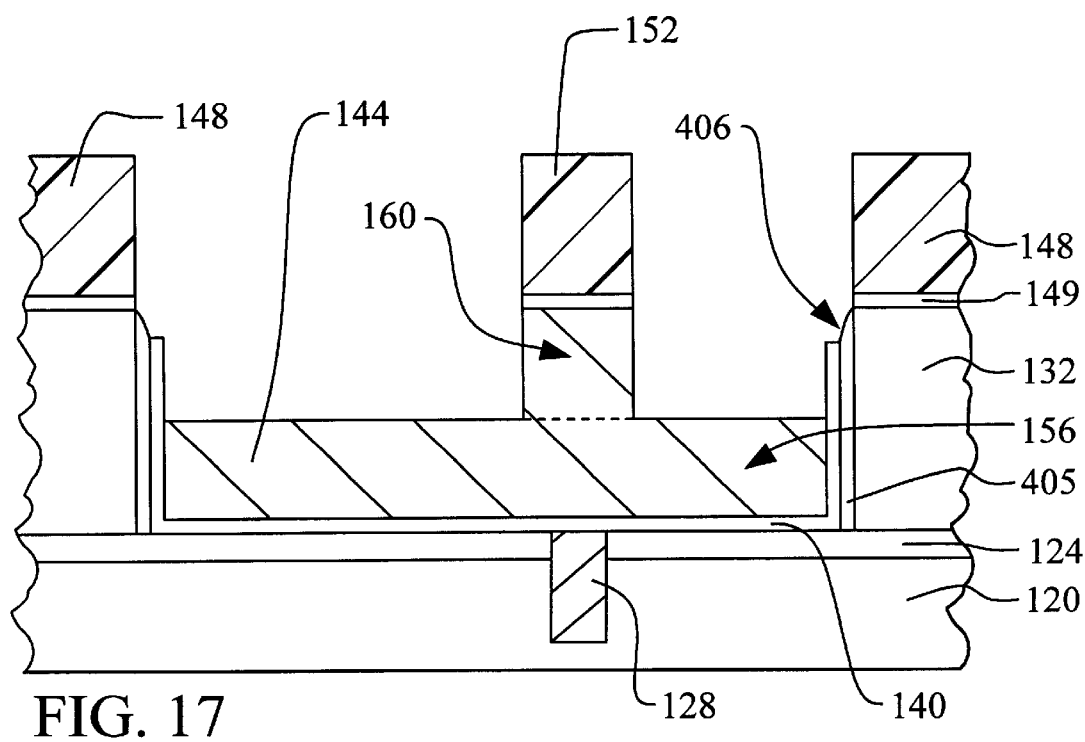

Referring now to FIG. 16, a conductive barrier layer 140 is deposited overlying the first dielectric layer 132, the insulating layer spacers 405, and the lining the trenches. The conductive barrier layer 140 may comprise any of the materials outlined above in the first embodiment. A metal layer 144 is deposited overlying the conductive barrier layer 140 and filling the trenches. The metal layer 144 and the conductive barrier layer 140 are subsequently polished down to form damascene interconnects 144.

The damascene interconnects 144 are patterned to form via plugs 152. This patterning is done by a photolithographic process. An organic bottom anti-reflective coating (BARC) layer 149 may optionally be applied overlying the metal layer 144 and the first dielectric layer 132 as outlined above in the first embodiment. A photoresist layer 148, 152 is applied overlying the BARC layer 149. After development, the photoresist layer 148, 152 remains overlying the first dielectric layer 132 and the damascene interconnects 144 while exposing a selected part of the damascene interconnects. The presence of the photoresist layer 148 overlying the first dielectric layer 132 protects the first dielectric layer 132 from metal diffusion, especially of copper, during the etching process.

The patterning of the damascene interconnects 144 is accomplished by plasma-assisted dry etching or by wet etching by methods disclosed above in the first embodiment. A wet etching selective to the metal layer 144 relative to the conductive barrier layer 140 is again preferred.

The etching process is timed such that the damascene interconnects 144 are only partially etched down. After the etch, via plugs 160 have been formed in an upper portion of the damascene interconnects 144. The remaining lower portion may now be called the conductive lines 156. Note that the via plugs 160 are formed from the same metal layer 144 as the conductive lines 156. Therefore, there is no possibility of the via plugs 160 being misaligned to the conductive lines 156.

The presence of the insulating layer spacers 405 prevents diffusion of metal ions, particularly copper, into the first dielectric layer 132 in two ways. First, if the photoresist sections 148 fall short of covering the conductive barrier layer 140 and the insulating layer spacers 405, metal contamination is prevented. Second, if the conductive barrier layer 140 is partially etched away 406 during the metal etch, metal contamination is prevented. After the metal etching process, the process of the present invention may be completed as disclosed above in the first embodiment.

Figure 18:
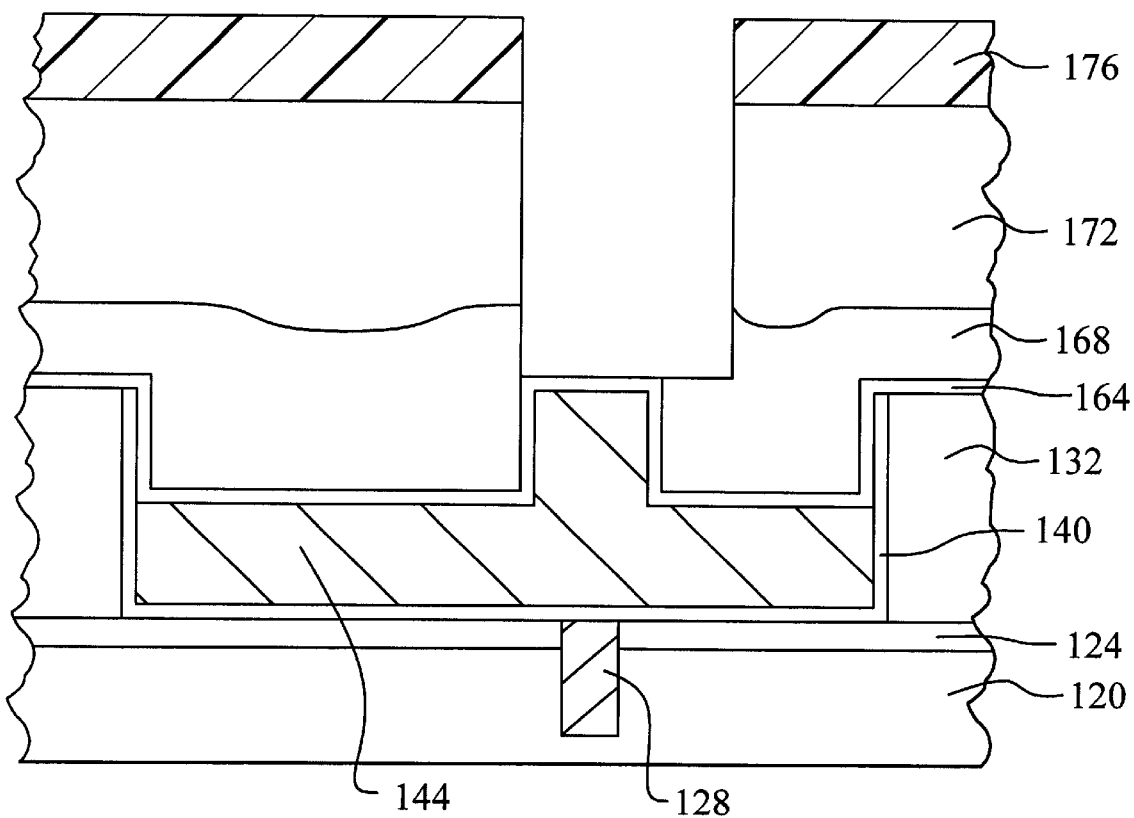
FIGS. 18 through 22 schematically illustrate in cross-sectional representation a third preferred embodiment of the present invention.

A third preferred embodiment of the present invention is now disclosed. An insulating layer spacer is herein incorporated into the present invention to enhance the process capability during metal layer etching into vias plugs and conductive lines for an upper level of interconnect. Referring again to FIG. 7, the process of the first preferred embodiment is suspended after the second dielectric layer 172 is planarized to complete the first level of reversed damascene metal interconnects. Referring now particularly to FIG. 18, the third preferred embodiment initiates with the application of a photoresist layer 176 overlying the second interlevel dielectric layer 168, 172. The photoresist layer 176 is exposed and developed as in the first level process of the first embodiment. The second dielectric layer 168, 172 is patterned to form trenches for the second-level damascene interconnects. Note that the etching of the second dielectric layer 168, 172 stops on the non-conductive barrier layer 164. The photoresist layer 176 is stripped away. A solvent stripper is preferably used for photoresist stripping, particularly if the lower part of the second dielectric layer 168 comprises an organic compound.

Figure 19:
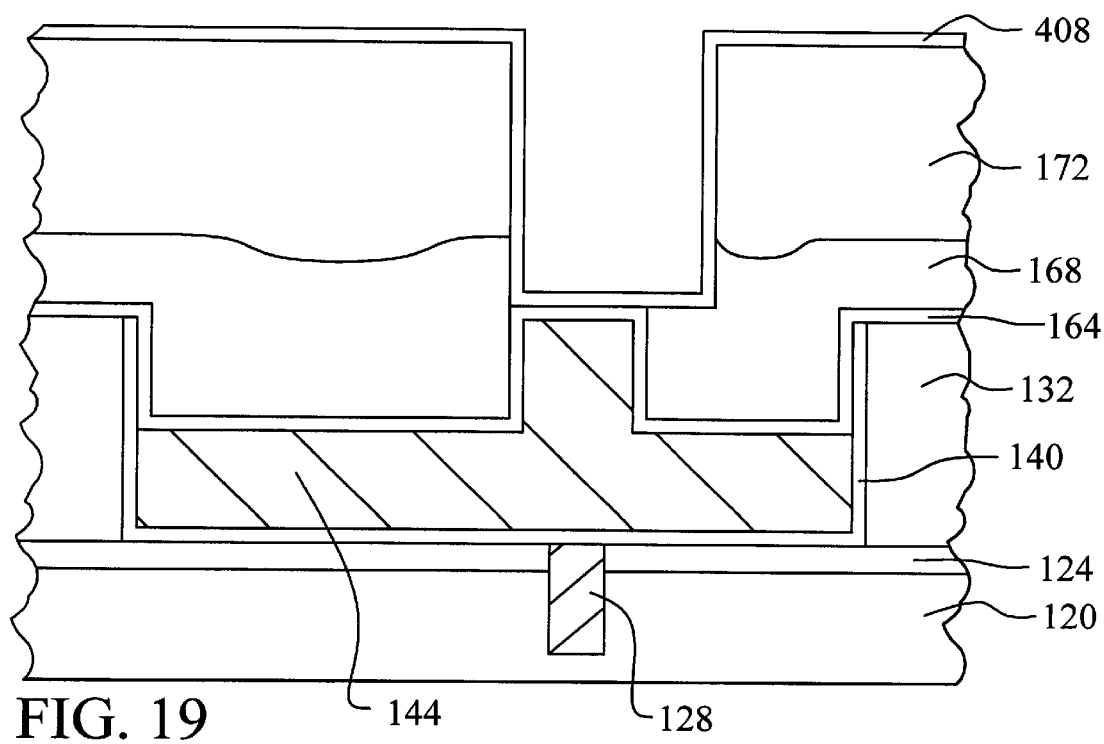

Referring now to FIG. 19, an insulating layer 408 is deposited overlying the first dielectric layer 172 and 168 and lining the trenches. The insulating layer 408 preferably comprises one of the group containing: silicon nitride, silicon oxynitride, BLok (from Applied Material Corporation), silicon carbide, boron nitride, carbon nitride, and carbon boron nitride. The insulating layer 408 is deposited to a thickness of between about 50 Angstroms and 5,000 Angstroms using a conventional deposition process depending upon the material type chosen. The insulating layer 408 may comprise the same material as the nonconductive barrier layer 164.

Figure 20:
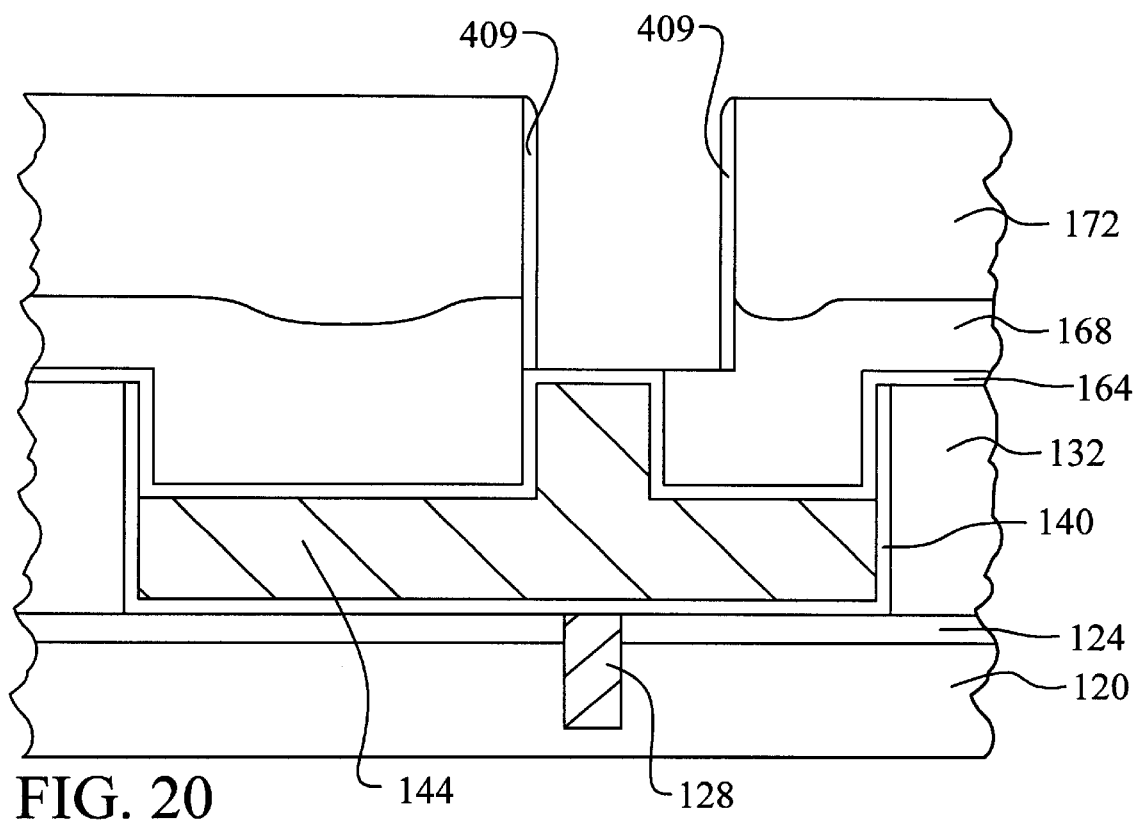

Referring now to FIG. 20, the insulating layer 408 is anisotropically etched to form insulation layer spacers 409 on the sidewalls of the trenches. The anisotropic etching is performed preferably by a plasma-assisted dry etching comprising an etching chemistry of one or more of the following gases: fluorocarbon, fluorine-substituted hydrocarbon, fluorine, chlorine, hydrocarbon, nitrogen, hydrogen, $BCl_3$, oxygen, and argon.

Figure 21:
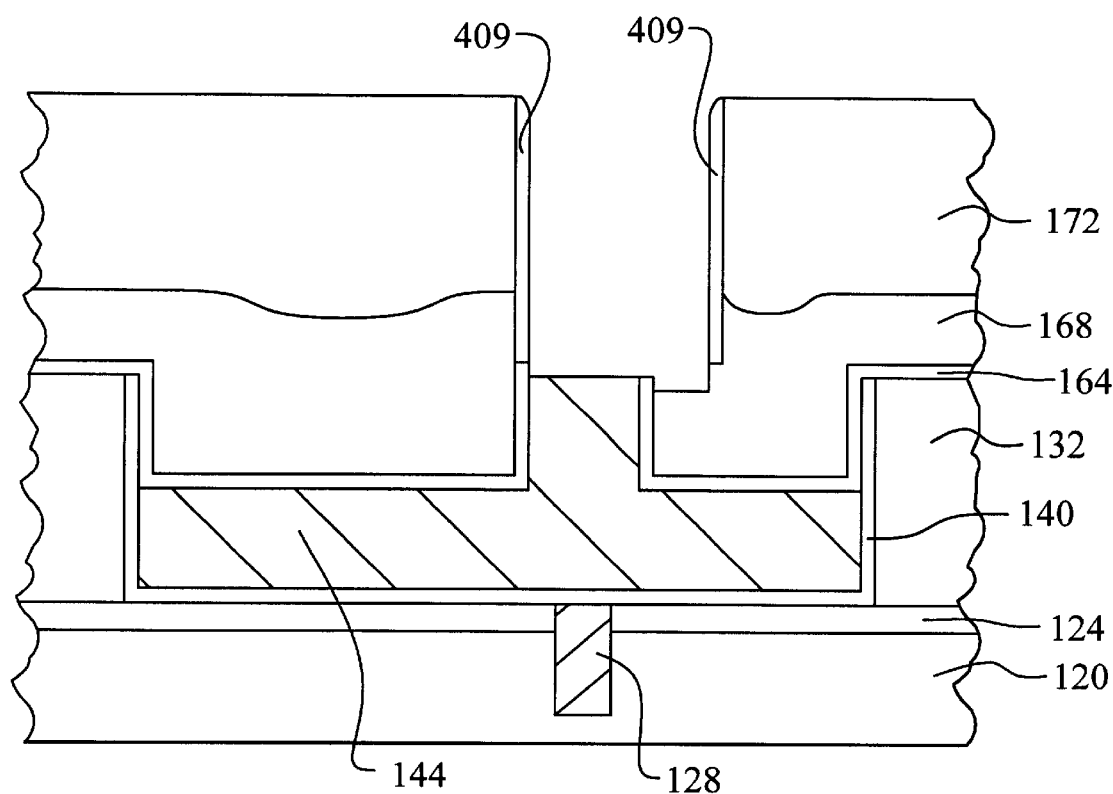

Referring now to FIG. 21, the nonconductive barrier layer 164 is etched through to expose the metal layer 144. The presence of the insulating layer spacers 409 on the sidewalls of the trenches prevents sputtered metal, metal oxides, and metal halides from diffusing into the second dielectric layer 168 and 172. After the nonconductive barrier layer 164 etch, a clean is performed to remove any remaining metal contaminants.

Figure 22:
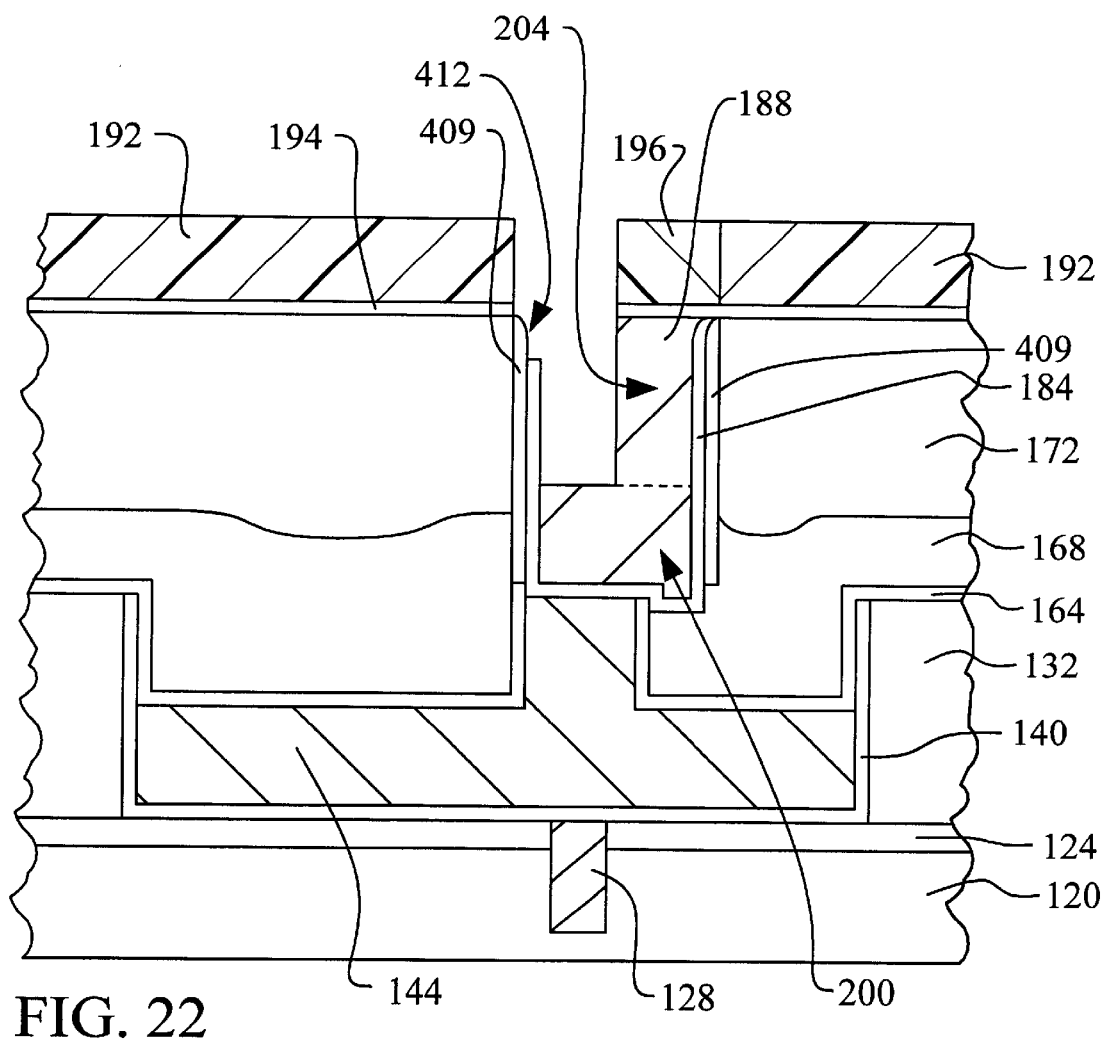

Referring now to FIG. 22, a second-level conductive barrier layer 184 is deposited overlying the second dielectric layer 168 and 172, the insulating layer spacers 409, and the lining the trenches. The second-level conductive barrier layer 184 may comprise any of the materials outlined above in the first embodiment. A second-level metal layer 188 is deposited overlying the second-level conductive barrier layer 184 and filling the trenches. The second-level metal layer 188 and the second-level conductive barrier layer 184 are subsequently polished down to form damascene interconnects 188.

The damascene interconnects 188 are patterned to form via plugs 204. This patterning is done by a photolithographic process. An organic bottom anti-reflective coating (BARC) layer 194 may optionally be applied overlying the second-level metal layer 188 and the second dielectric layer 172 as outlined above in the first embodiment. A photoresist layer 192, 196 is applied overlying the BARC layer 194. After development, the photoresist layer 192, 196 remains overlying the second dielectric layer 172 and the damascene interconnects 188 while exposing a selected part of the damascene interconnects. The presence of the photoresist layer 192 overlying the second dielectric layer 172 protects the second dielectric layer 172 from metal diffusion, especially of copper, during the etching process.

The patterning of the damascene interconnects 188 is accomplished by plasma-assisted dry etching or by wet etching by methods disclosed above in the first embodiment. A wet etching selective to the second-level metal layer 188 relative to the second-level conductive barrier layer 184 is again preferred.

The etching process is timed such that the damascene interconnects 188 are only partially etched down. After the etch, via plugs 204 have been formed in an upper portion of the damascene interconnects 188. The remaining lower portion may now be called the conductive lines 200. Note that the via plugs 204 are formed from the same second-level metal layer 188 as the conductive lines 200. Therefore, there is no possibility of the via plugs 204 being misaligned to the conductive lines 200.

The presence of the insulating layer spacers 409 prevents diffusion of metal ions, particularly copper, into the second dielectric layer 172 and 168 in two ways. First, if the photoresist sections 192 fall short of covering the second-level conductive barrier layer 184 and the insulating layer spacers 409, metal contamination is prevented. Second, if the second-level conductive barrier layer 184 is partially etched away 412 during the metal etch, metal contamination is prevented. After the metal etching process, the process of the present invention may be completed as disclosed above in the first embodiment.

Figure 23:
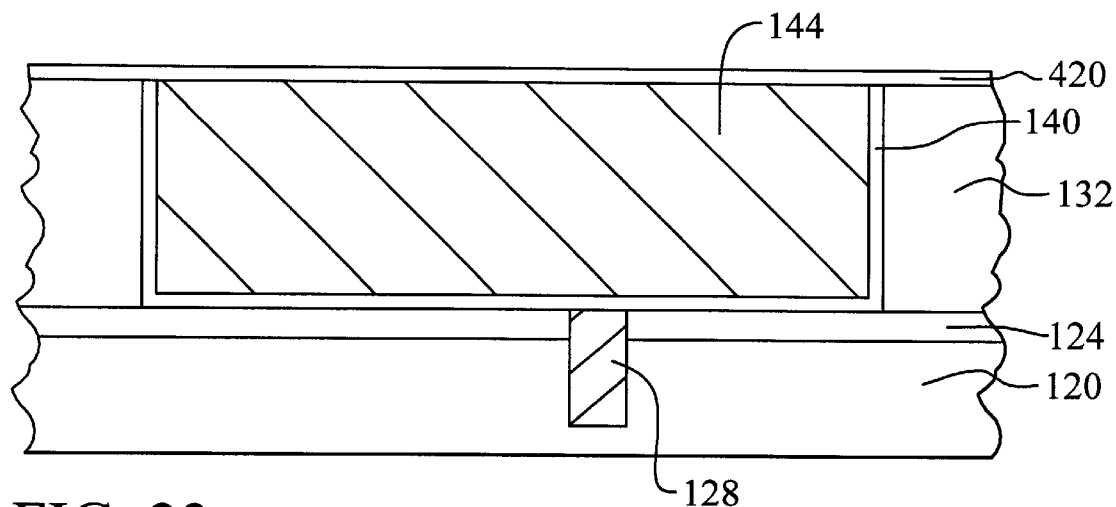
FIGS. 23 through 26 schematically illustrate in cross-sectional representation a fourth preferred embodiment of the present invention.

A fourth preferred embodiment of the present invention is now disclosed. A passivation layer is herein incorporated into the present invention to enhance the process capability of metal layer etching into vias plugs and conductive lines for a first level of interconnect. Referring again to FIG. 5, the process of the first preferred embodiment is suspended after the metal layer 144 and the conductive barrier layer 140 are polished down to form damascene interconnects. Referring now particularly to FIG. 23, the fourth preferred embodiment initiates with the deposition of a passivation layer 420 overlying the first dielectric layer 132, the metal layer 144, and the conductive barrier layer 140. The passivation layer 420 comprises one of the group containing: silicon nitride, silicon carbide, silicon oxynitride, and BLok (Applied Materials Corporation). The passivation layer 420 is deposited to a thickness of between about 50 Angstroms and 3,000 Angstroms.

Figure 24:
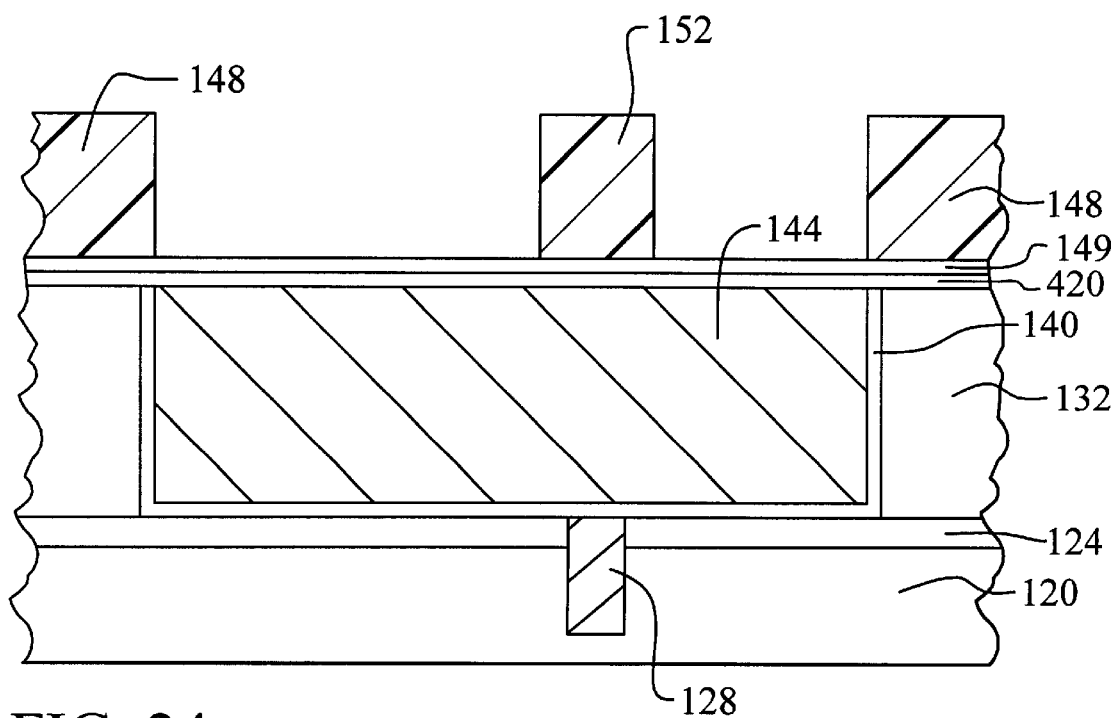

Referring now to FIG. 24, an organic bottom anti-reflective coating (BARC) layer 149, as disclosed above in the first embodiment, may optionally be applied overlying the passivation layer 420. A photoresist layer 148, 152 is applied overlying the BARC layer 149. After development, the photoresist layer 148, 152 remains overlying the first dielectric layer 132 and the damascene interconnects 144 while exposing a selected part of the damascene interconnects.

Figure 25:
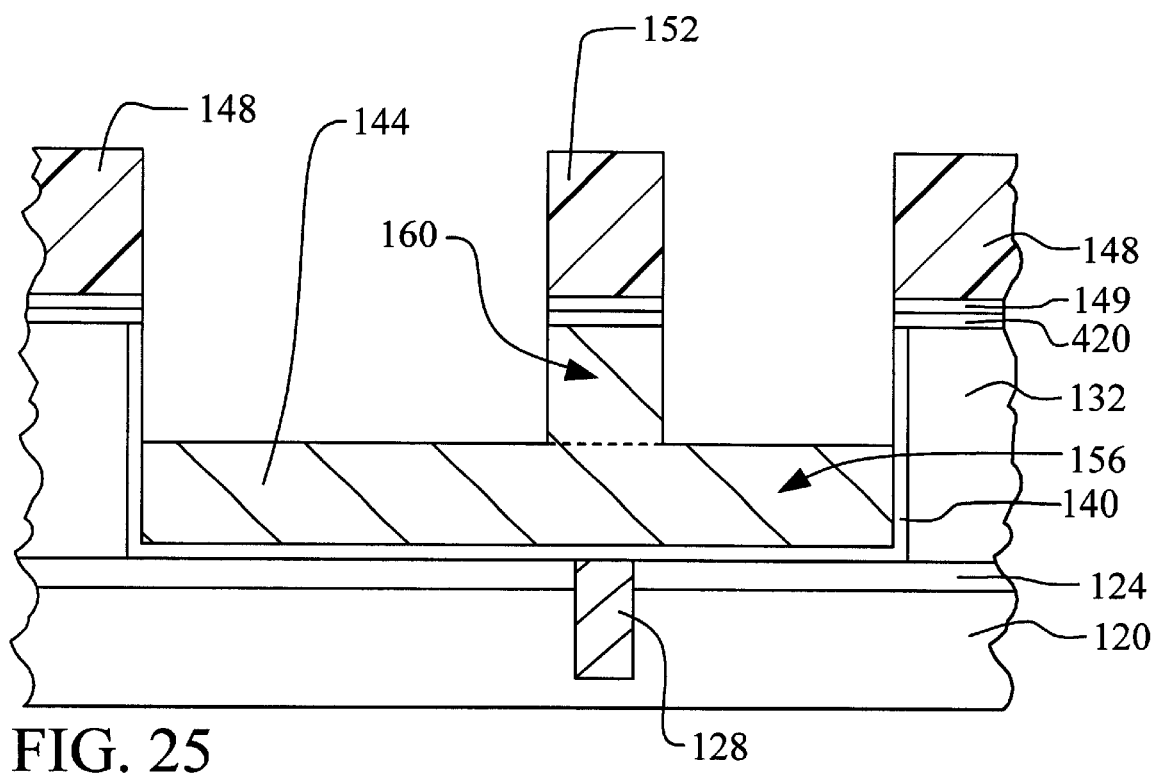

Referring now to FIG. 25, the BARC layer 149, passivation layer 420, and the metal layer 144 are etched down using a plasma-assisted dry etching process. The plasma-assisted dry etching process preferably uses an etching chemistry comprising one or more of the following gases: fluorocarbon, fluorine-substituted hydrocarbon, fluorine, chlorine, hydrocarbon, nitrogen, hydrogen, $BCl_3$, oxygen, and argon. The etching process is timed such that the damascene interconnects 144 are only partially etched down. After the etch, via plugs 160 have been formed in an upper portion of the damascene interconnects 144. The remaining lower portion may now be called the conductive lines 156. Note that the via plugs 160 are formed from the same metal layer 144 as the conductive lines 156. Therefore, there is no possibility of the via plugs 160 being misaligned to the conductive lines 156.

The presence of the passivation layer 420 prevents diffusion of metal ions, particularly copper, into the first dielectric layer 132 during the metal etch.

Figure 26:
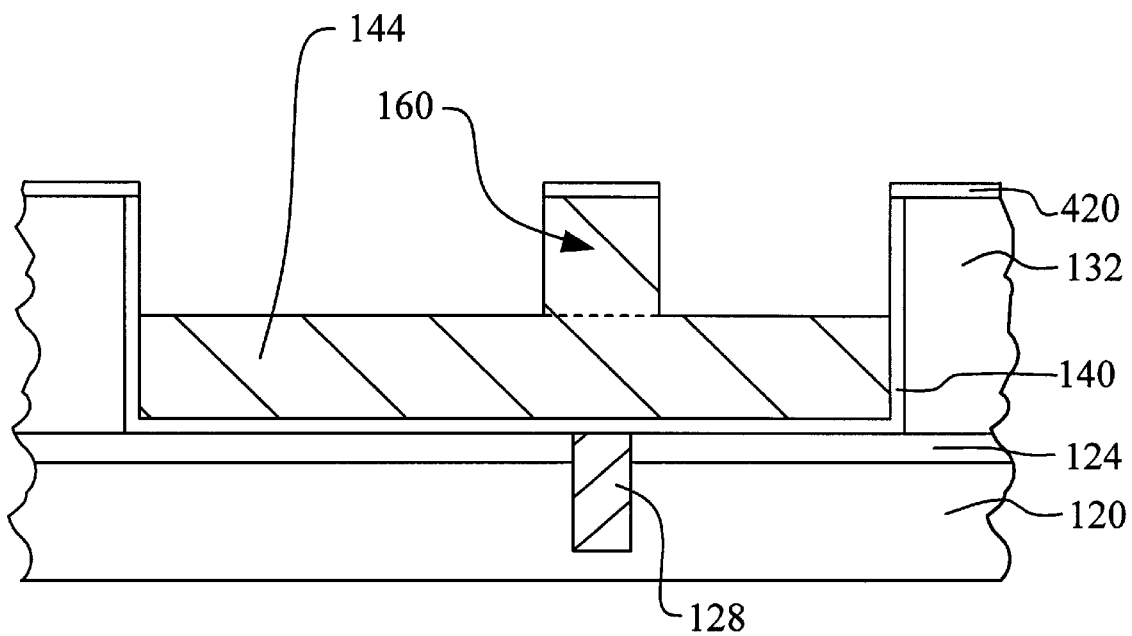

Referring now to FIG. 26, the photoresist layer 148 and 152 and the BARC layer 149 are stripped away. Solvent strippers are preferably used that are compatible with a copper metal layer. Oxygen ashing can also be used. However, a hydrogen or ammonia plasma treatment may be needed to remove the copper oxide prior to the subsequent deposition of the nonconductive barrier layer. The process of the present invention may then be completed as disclosed above in the first embodiment.

Figure 27:
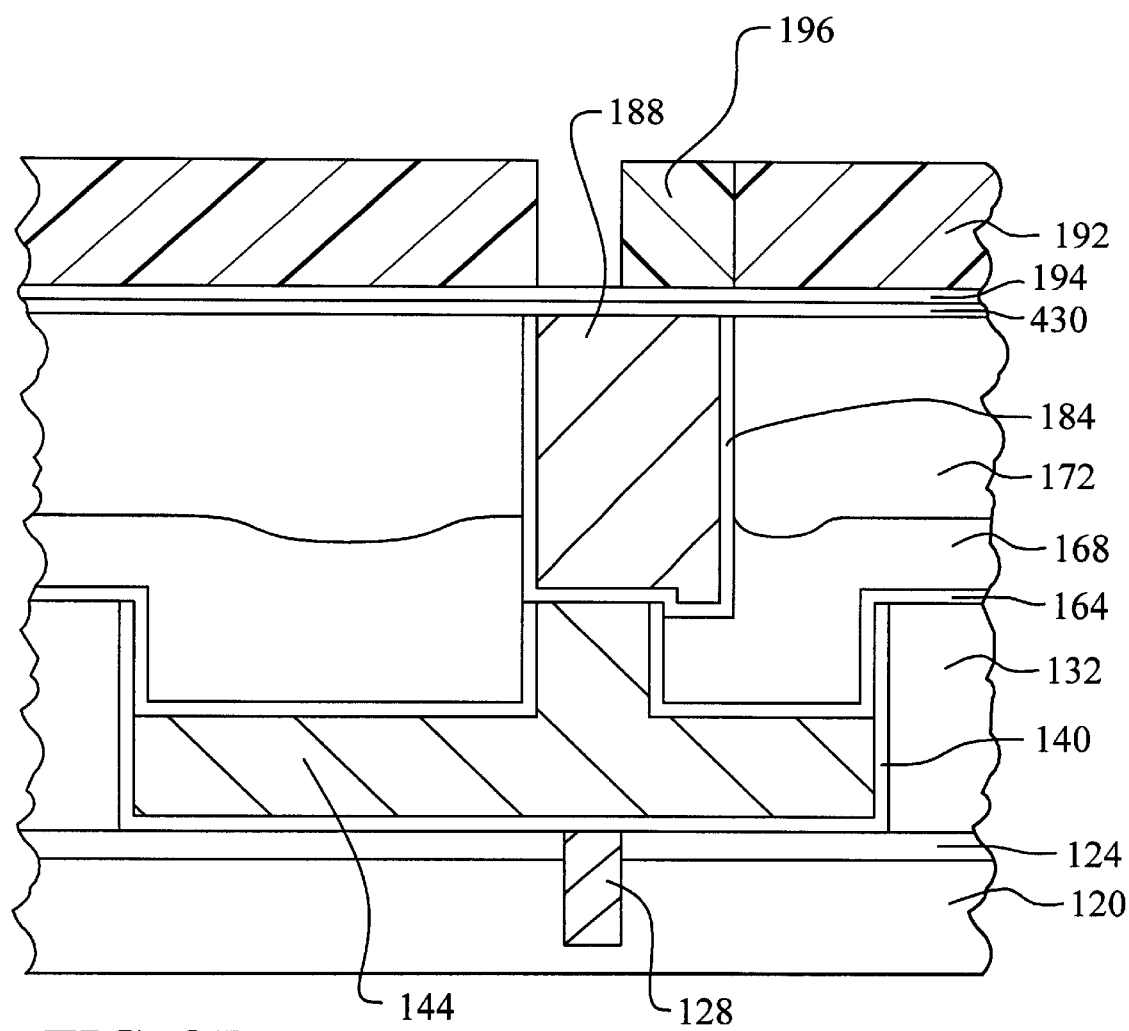
FIGS. 27 and 28 schematically illustrate in cross-sectional representation a fifth preferred embodiment of the present invention.

A fifth preferred embodiment of the present invention is now disclosed. A passivation layer is herein incorporated into the present invention to enhance the process capability during second-level metal layer etching into vias plugs and conductive lines for an upper level of interconnect. Referring again to FIG. 10, the process of the first preferred embodiment is suspended after the second-level metal layer 188 and the second-level conductive barrier layer 184 are polished down to form damascene interconnects. Referring now particularly to FIG. 27, the fifth preferred embodiment initiates with the deposition of a passivation layer 430 overlying the second dielectric layer 172, the second-level metal layer 188 and the second-level conductive barrier layer 184. The passivation layer 430 comprises one of the group containing: silicon nitride, silicon carbide, silicon oxynitride, and BLok by Applied Materials Corporation. The passivation layer 430 is deposited to a thickness of between about 50 Angstroms and 3,000 Angstroms.

An organic bottom anti-reflective coating (BARC) layer 194, as disclosed above in the first embodiment, may optionally be applied overlying the passivation layer 430. A photoresist layer 192 and 196 is applied overlying the BARC layer 194. The photoresist layer 192 and 196 is exposed and developed as in the second level process of the first embodiment.

Figure 28:
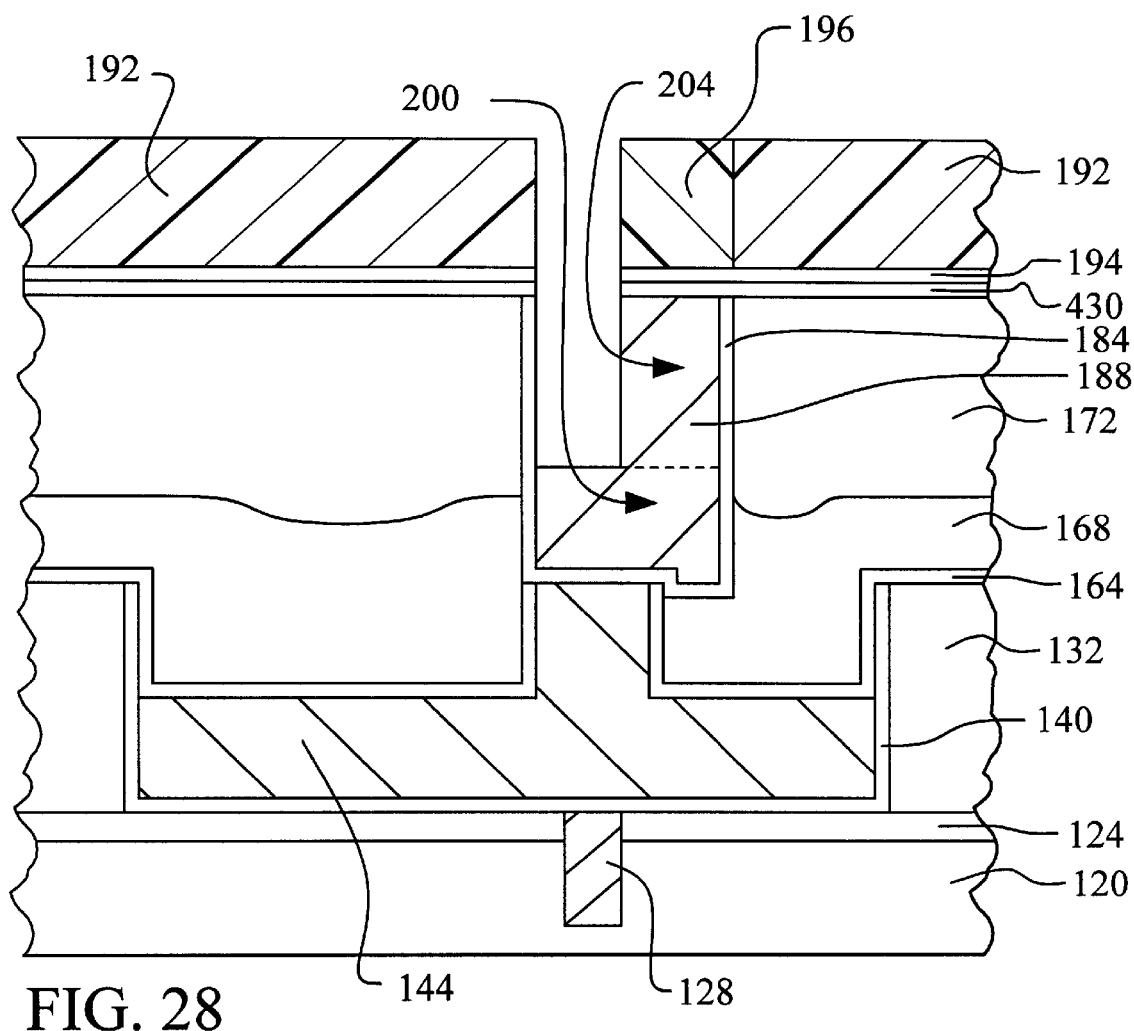

Referring now to FIG. 28, the BARC layer 194 and the passivation layer 430 are etched using a plasma-assisted dry etch. The plasma-assisted dry etch is performed using an etching chemistry comprising one or more of the following gases: fluorocarbon, fluorine-substituted hydrocarbon, fluorine, chlorine, hydrocarbon, nitrogen, hydrogen, oxygen, and argon. The plasma-assisted dry etching may be continued to etch the damascene interconnects 188 and to thereby form via plugs 204. The plasma-assisted dry etching of the metal layer 188 preferably comprises one or more of the following gases: fluorocarbon, fluorine-substituted hydrocarbon, fluorine, chlorine, hydrocarbon, nitrogen, hydrogen, oxygen, $BCl_3$, and argon.

The etching process is timed such that the damascene interconnects 188 are only partially etched down. After the etch, via plugs 204 have been formed in an upper portion of the damascene interconnects 188. The remaining lower portion may now be called the conductive lines 200. Note that the via plugs 204 are formed from the same second-level metal layer 188 as the conductive lines 200. Therefore, there is no possibility of the via plugs 204 being misaligned to the conductive lines 200.

The presence of the passivation layer 430 prevents diffusion of metal ions, particularly copper, into the second dielectric layer 172. After the metal etching process, the photoresist layer 192 and 196 and the BARC layer 194 are removed, preferably by using solvent strippers that are compatible with a copper metal layer 188. Oxygen ashing can be used, however, a hydrogen or ammonia plasma treatment may be needed to subsequently remove the copper oxide. The process of the present invention may be completed as disclosed above in the first embodiment.

Figure 29:
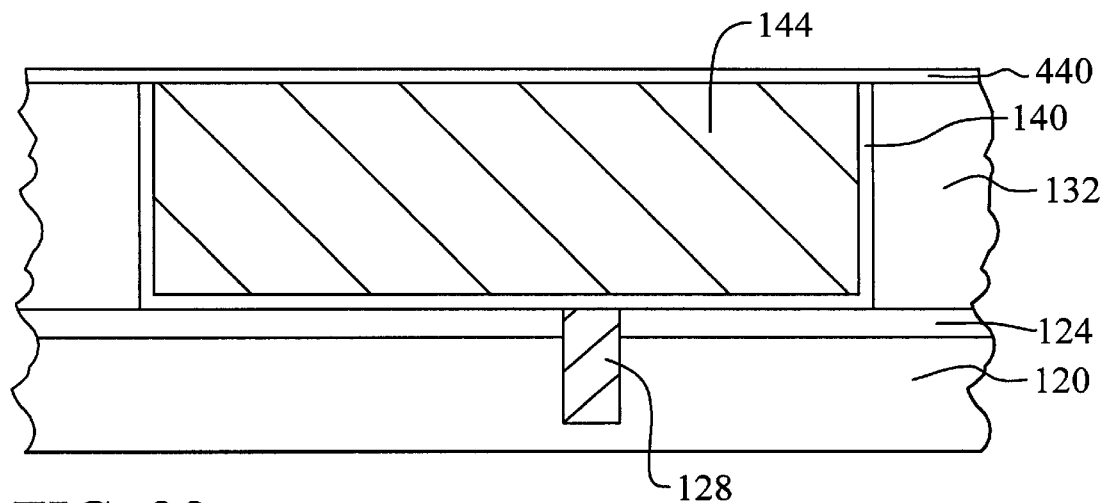
FIGS. 29 through 32 schematically illustrate in cross-sectional representation a sixth preferred embodiment of the present invention.

A sixth preferred embodiment of the present invention is now disclosed. A passivation layer is herein incorporated into the present invention to enhance the process capability of metal layer etching into vias plugs and conductive lines for a first level of interconnect. Referring again to FIG. 5, the process of the first preferred embodiment is suspended after the metal layer 144 and the conductive barrier layer 140 are polished down to form damascene interconnects. Referring now particularly to FIG. 29, the sixth preferred embodiment initiates with the deposition of a passivation layer 440 overlying the first dielectric layer 132, the metal layer 144, and the conductive barrier layer 140. The passivation layer 440 comprises one of the group containing: silicon nitride, silicon carbide, silicon oxynitride, and BLok (Applied Materials Corporation). The passivation layer 440 is deposited to a thickness of between about 50 Angstroms and 3,000 Angstroms.

Figure 30:
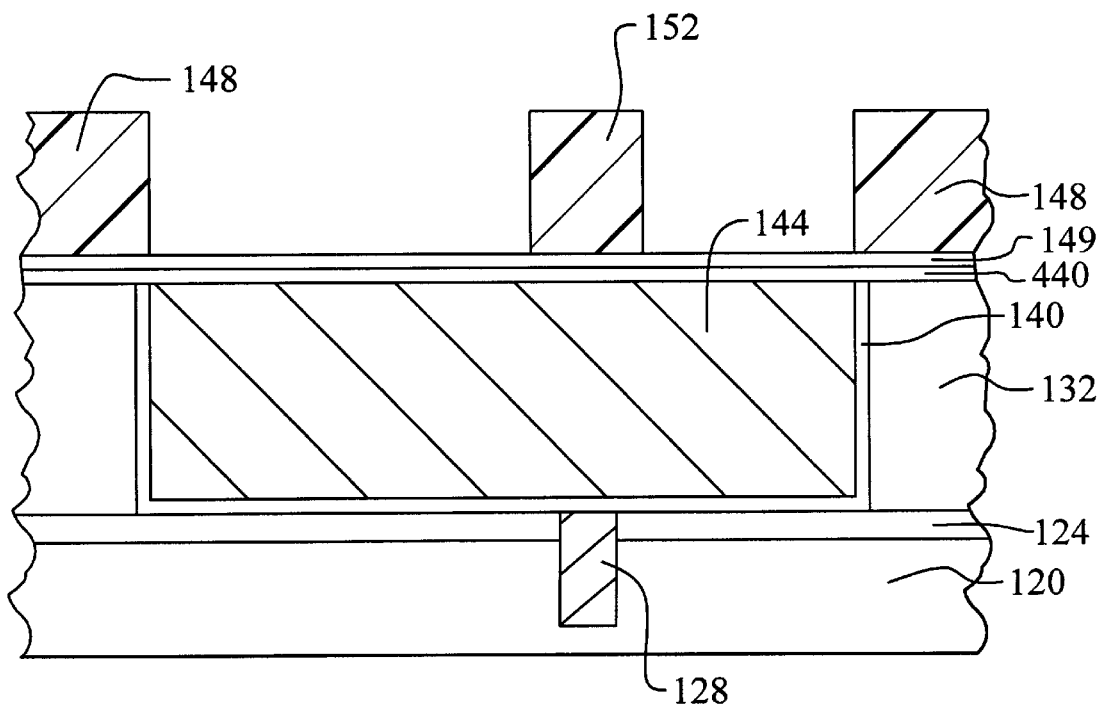

Referring now to FIG. 30, an organic bottom anti-reflective coating (BARC) layer 149, as disclosed above in the first embodiment, may optionally be applied overlying the passivation layer 440. A photoresist layer 148, 152 is applied overlying the BARC layer 149. After development, the photoresist layer 148, 152 remains overlying the first dielectric layer 132 and the damascene interconnects 144 while not covering a selected part of the damascene interconnects.

Figure 31:
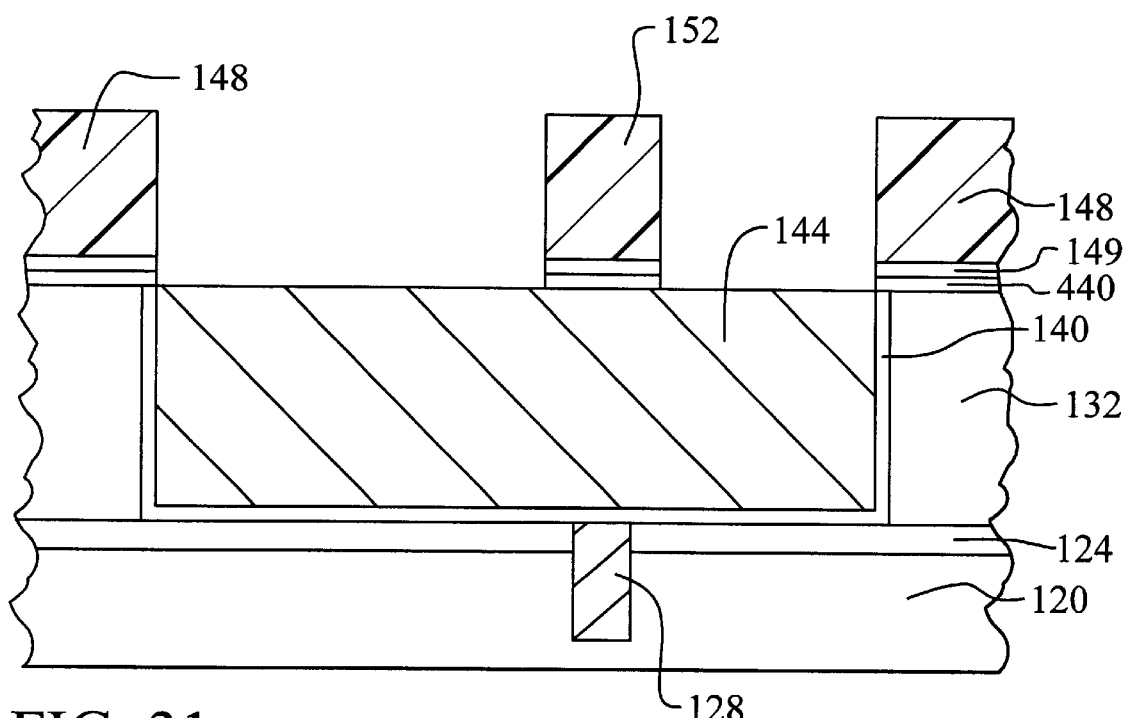

Referring now to FIG. 31, the BARC layer 149 and the passivation layer 440 are etched down using a plasma-assisted dry etching process. The plasma-assisted dry etching process using an etching chemistry comprising one or more of the following gases: fluorocarbon, fluorine-substituted hydrocarbon, fluorine, chlorine, hydrocarbon, nitrogen, hydrogen, oxygen, and argon. Note that in this embodiment the dry-etching process does not etch the metal layer 144.

Figure 32:
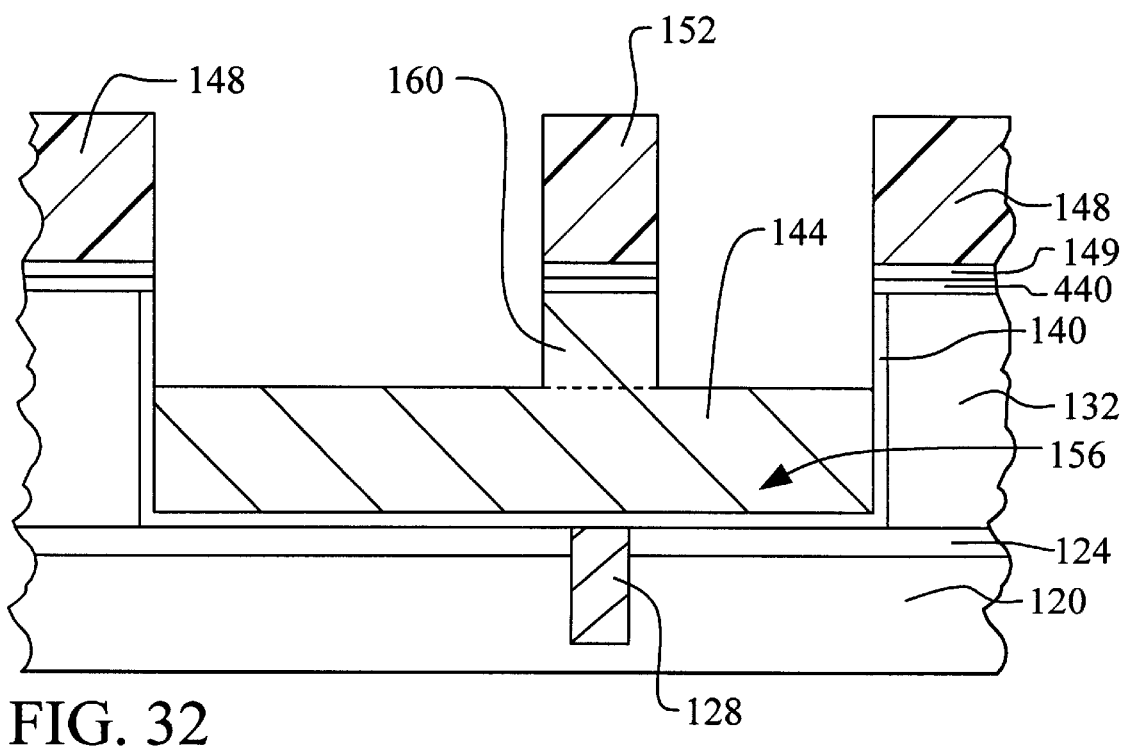

Referring now to FIG. 32, the metal layer 144 is etched down using a wet etch process to form via plugs 160. The etching process is timed such that the damascene interconnects 144 are only partially etched down. After the etch, via plugs 144 have been formed in an upper portion of the damascene interconnects 160. The remaining lower portion may now be called the conductive lines 156. Note that the via plugs 160 are formed from the same metal layer 144 as the conductive lines 156. Therefore, there is no possibility of the via plugs 160 being misaligned to the conductive lines 156.

The presence of the passivation layer 440 prevents diffusion of metal ions, particularly copper, into the first dielectric layer 132 during the metal etch. The photoresist layer 148 and 152 and the BARC layer 149 are stripped away. Solvent strippers are preferably used that are compatible with a copper metal layer. Oxygen ashing can also be used. However, a hydrogen or ammonia plasma treatment may be needed to remove the copper oxide prior to the subsequent deposition of the nonconductive barrier layer. The process of the present invention may then be completed as disclosed above in the first embodiment.

Figure 33:
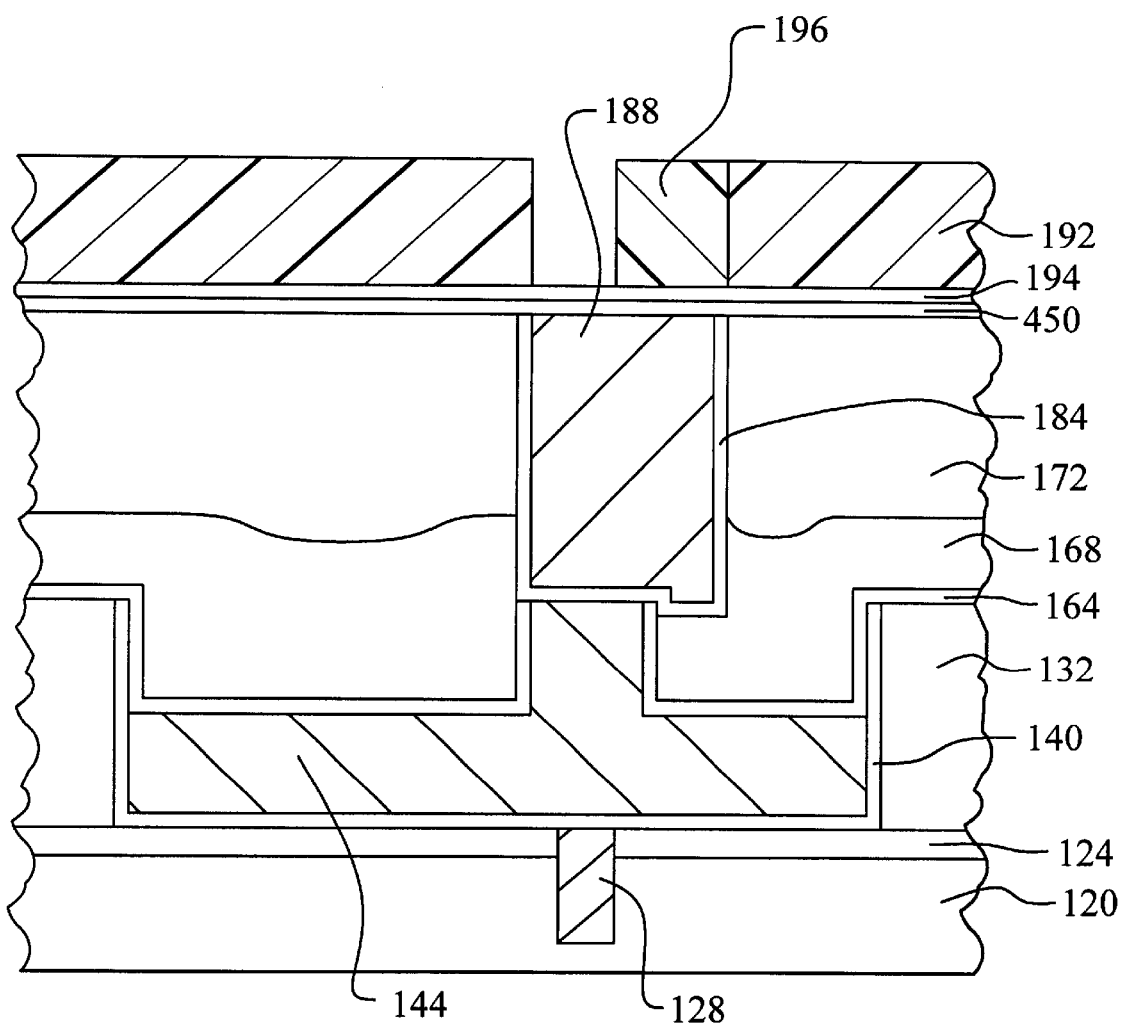
FIGS. 33 through 35 schematically illustrate in cross-sectional representation a seventh preferred embodiment of the present invention.

A seventh preferred embodiment of the present invention is now disclosed. A passivation layer is herein incorporated into the present invention to enhance the process capability during second-level metal layer etching into vias plugs and conductive lines for an upper level of interconnect. Referring again to FIG. 10, the process of the first preferred embodiment is suspended after the second-level metal layer 188 and the second-level conductive barrier layer 184 are polished down to form damascene interconnects. Referring now particularly to FIG. 33, the seventh preferred embodiment initiates with the deposition of a passivation layer 450 overlying the second dielectric layer 172, the second-level metal layer 188 and the second-level conductive barrier layer 184. The passivation layer 450 comprises one of the group containing: silicon nitride, silicon carbide, silicon oxynitride, and BLok by Applied Materials Corporation. The passivation layer 450 is deposited to a thickness of between about 50 Angstroms and 3,000 Angstroms.

An organic bottom anti-reflective coating (BARC) layer 194, as disclosed above in the first embodiment, may optionally be applied overlying the passivation layer 450. A photoresist layer 192 is applied overlying the BARC layer 194. The photoresist layer 192 is exposed and developed as in the second level process of the first embodiment.

Figure 34:
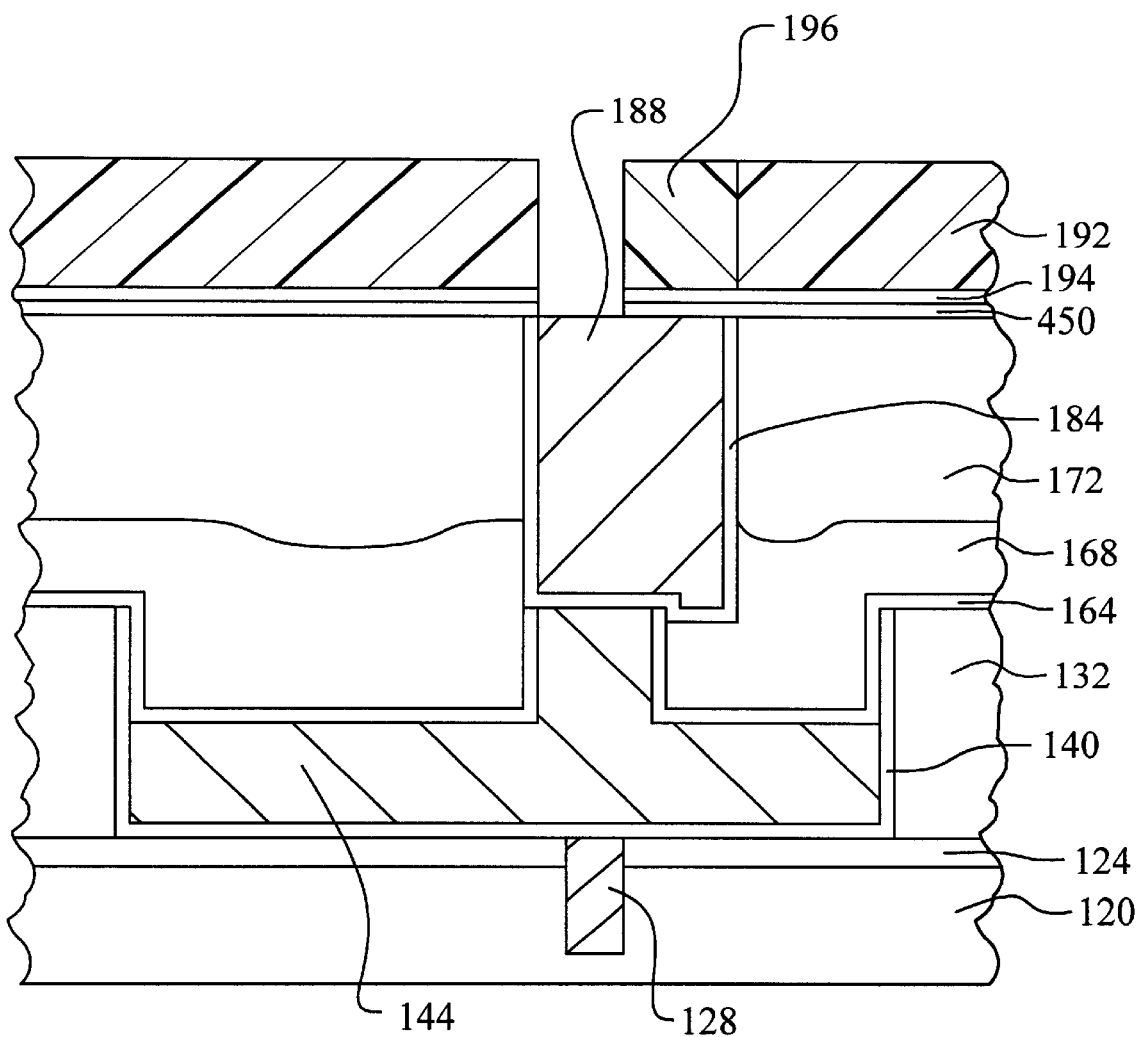

Referring now to FIG. 34, the BARC layer 194 and the passivation layer 450 are etched using a plasma-assisted dry etch. The plasma-assisted dry etch is performed using an etching chemistry comprising one or more of the following gases: fluorocarbon, fluorine-substituted hydrocarbon, fluorine, chlorine, hydrocarbon, nitrogen, hydrogen, oxygen, and argon. Note that the second-level metal layer 188 is not etched at this point.

Figure 35:
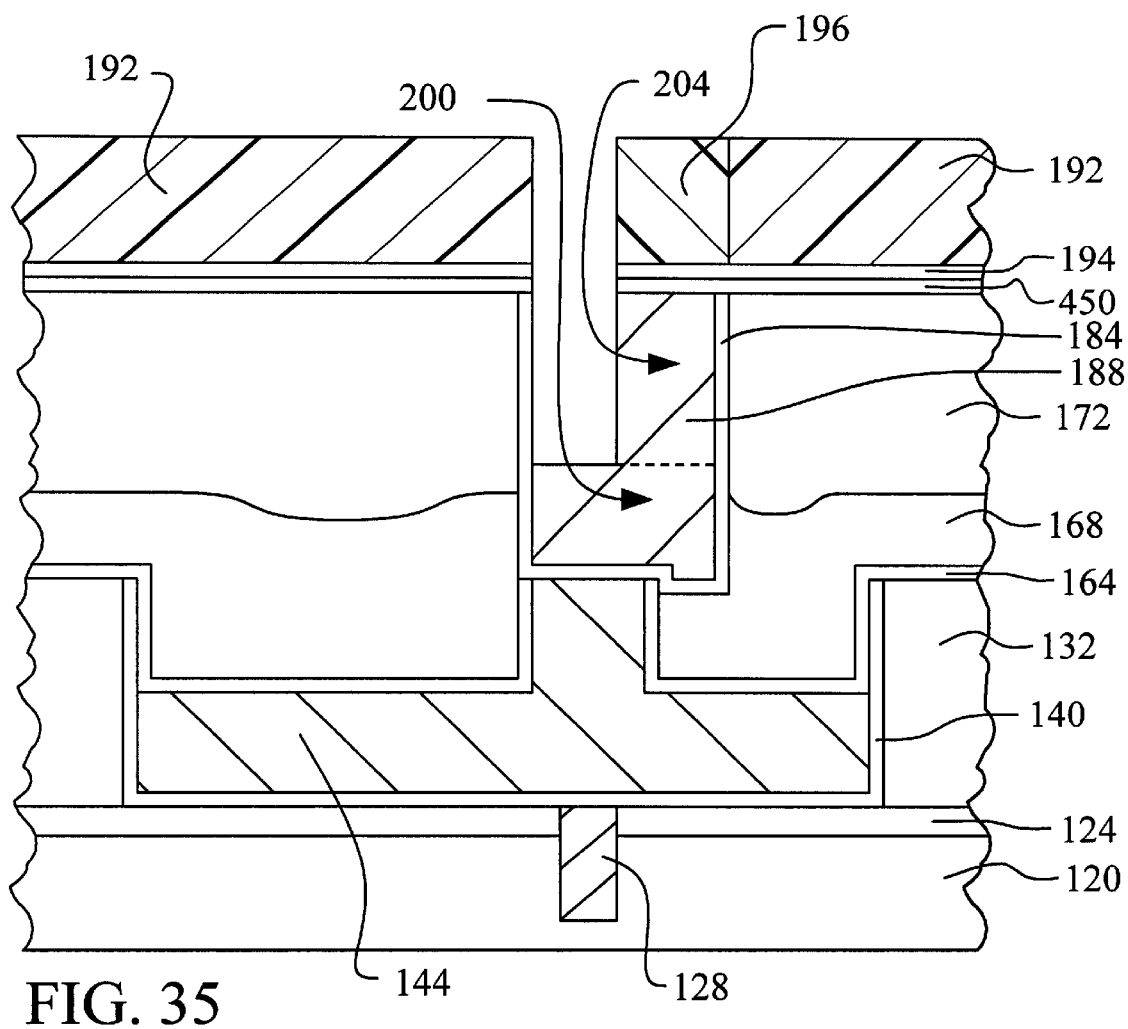

Referring now to FIG. 35, the second-level metal layer 188 is etched down using a wet etching process to form via plugs 204. The etching process is timed such that the damascene interconnects 188 are only partially etched down. After the etch, via plugs 204 have been formed in an upper portion of the damascene interconnects 188. The remaining lower portion may now be called the conductive lines 200. Note that the via plugs 204 are formed from the same metal layer 188 as the conductive lines 200. Therefore, there is no possibility of the via plugs 204 being misaligned to the conductive lines 200.

The presence of the passivation layer 450 prevents diffusion of metal ions, particularly copper, into the second dielectric layer 172 during the metal etch. The photoresist layer 192 and 196 and the BARC layer 194 are stripped away. Solvent strippers are preferably used that are compatible with a copper metal layer. Oxygen ashing can also be used. However, a hydrogen or ammonia plasma treatment may be needed to remove the copper oxide prior to the subsequent deposition of the nonconductive barrier layer. The process of the present invention may then be completed as disclosed above in the first embodiment.

Figure 36:
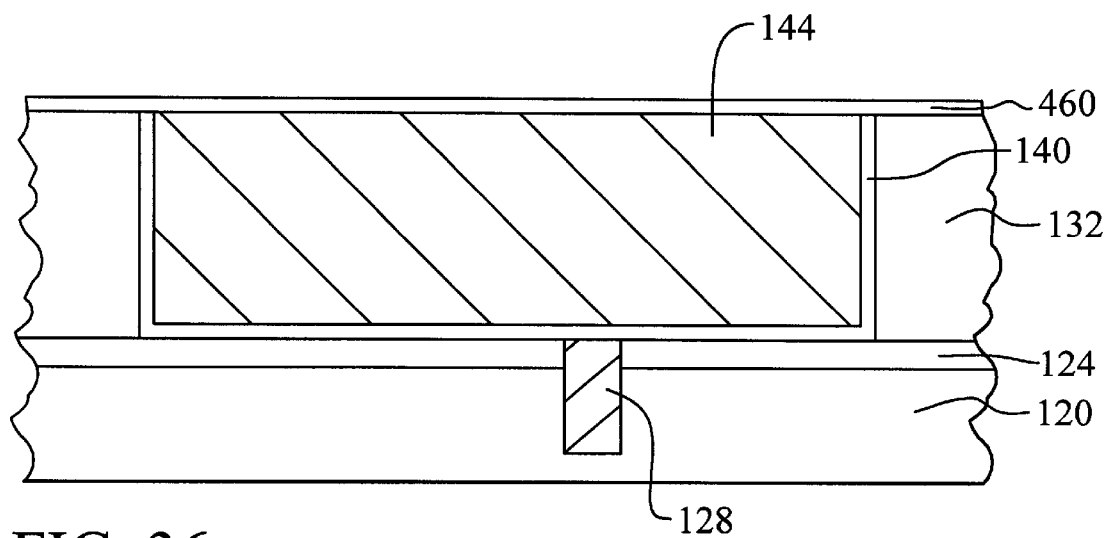
FIGS. 36 through 39 schematically illustrate in cross-sectional representation a eighth preferred embodiment of the present invention.

An eighth preferred embodiment of the present invention is now disclosed. A passivation layer is herein incorporated into the present invention to enhance the process capability of metal layer etching into vias plugs and conductive lines for a first level of interconnect and to act as a hard mask for the metal layer etch. Referring again to FIG. 5, the process of the first preferred embodiment is suspended after the metal layer 144 and the conductive barrier layer 140 are polished down to form damascene interconnects. Referring now particularly to FIG. 36, the eighth preferred embodiment initiates with the deposition of a passivation layer 460 overlying the first dielectric layer 132, the metal layer 144, and the conductive barrier layer 140. The passivation layer 460 comprises one of the group containing: silicon nitride, silicon carbide, silicon oxynitride, and BLok (Applied Materials Corporation). The passivation layer 460 is deposited to a thickness of between about 50 Angstroms and 3,000 Angstroms.

Figure 37:
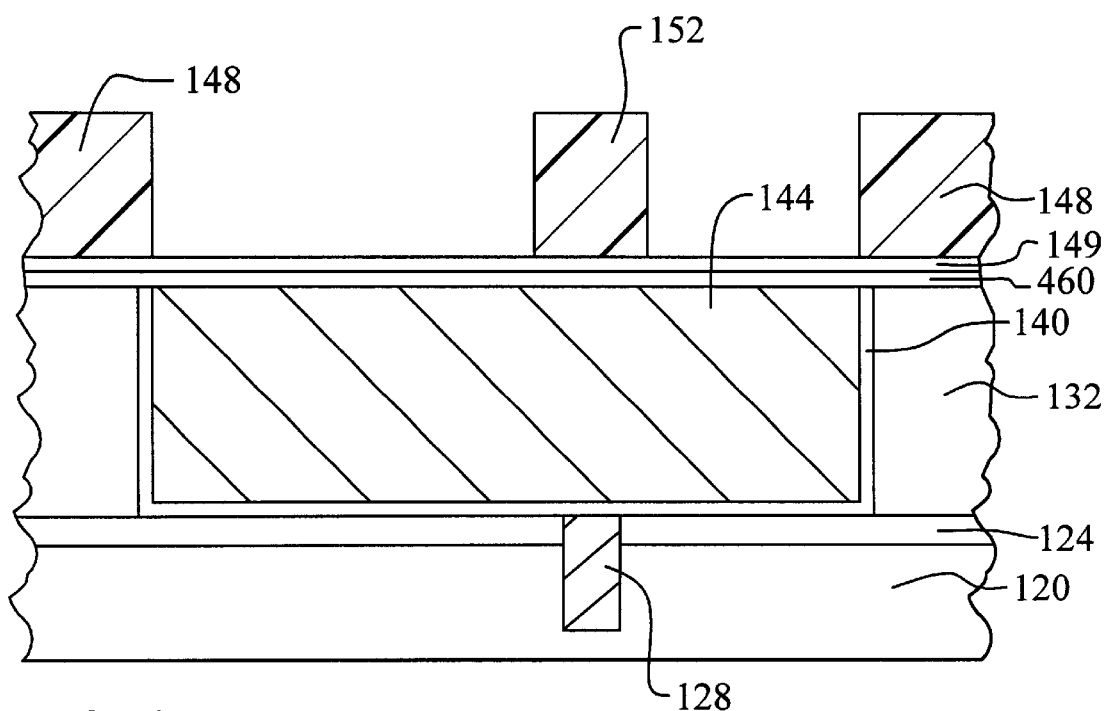

Referring now to FIG. 37, an organic bottom anti-reflective coating (BARC) layer 149, as disclosed above in the first embodiment, may optionally be applied overlying the passivation layer 460. A photoresist layer 148, 152 is applied overlying the BARC layer 149. After development, the photoresist layer 148, 152 remains overlying the first dielectric layer 132 and the damascene interconnects 144 while not covering a selected part of the damascene interconnects.

Figure 38:
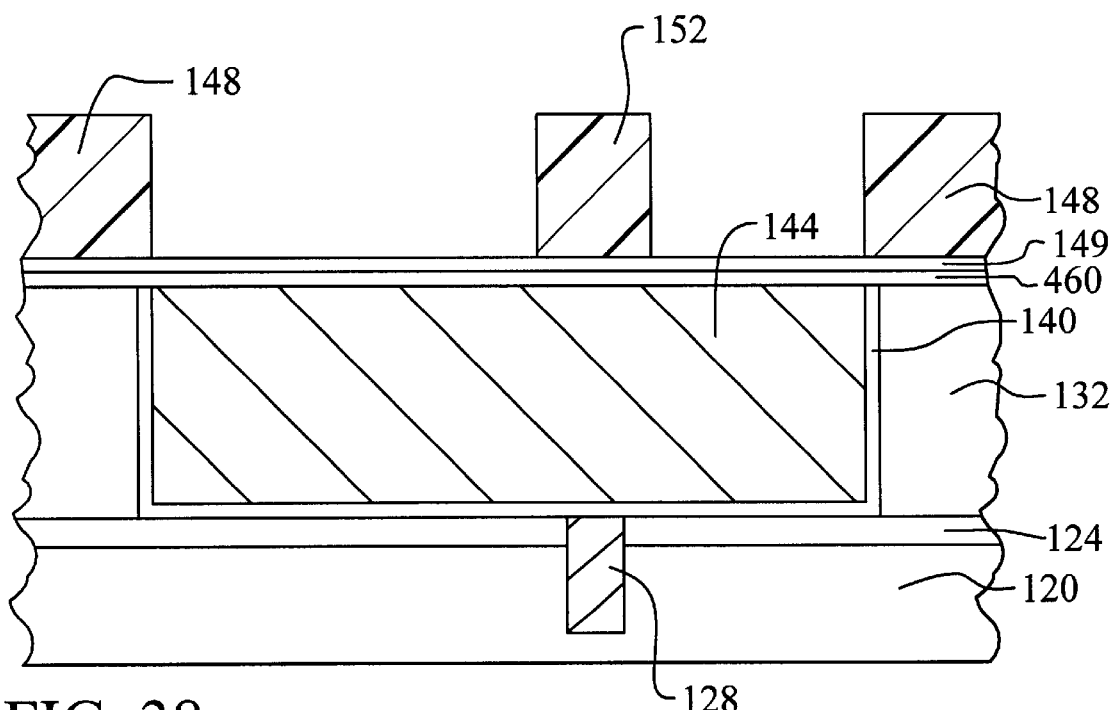

Referring now to FIG. 38, the BARC layer 149 and the passivation layer 460 are etched down using a plasma-assisted dry etching process. The plasma-assisted dry etching process using an etching chemistry comprising one or more of the following gases: fluorocarbon, fluorine-substituted hydrocarbon, fluorine, chlorine, hydrocarbon, nitrogen, hydrogen, oxygen, and argon. Note that in this embodiment the dry-etching process does not etch the metal layer 144.

Figure 39:
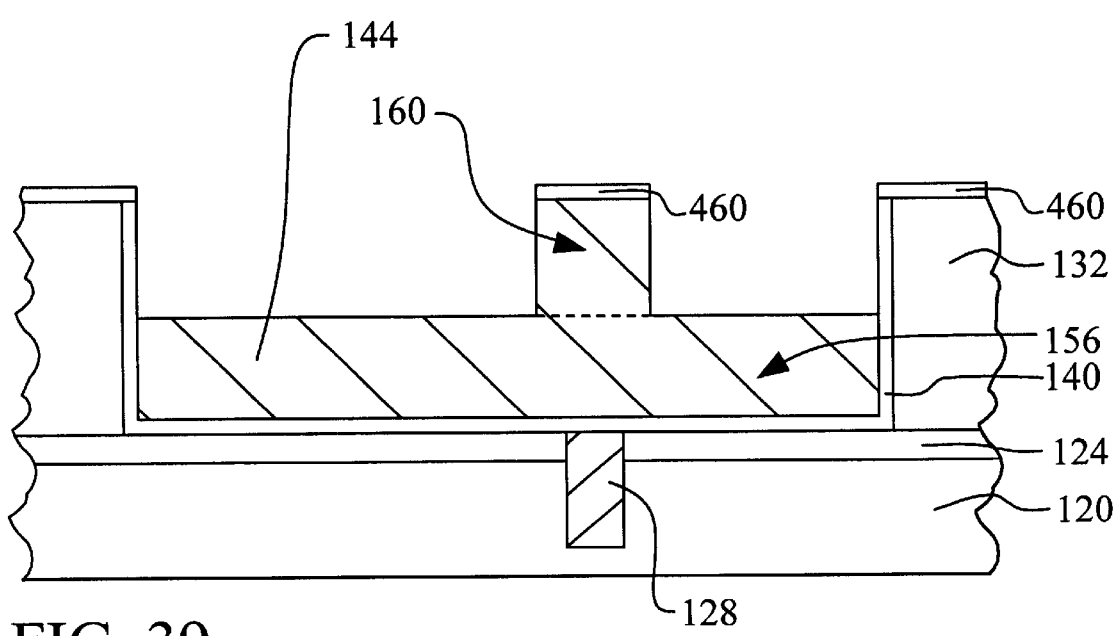

Referring now to FIG. 39, the photoresist layer 148 and 152 and the BARC layer 149 are stripped away. Solvent strippers are preferably used that are compatible with a copper metal layer. Oxygen ashing can also be used. However, a hydrogen or ammonia plasma treatment may become optional to remove the copper oxide prior to the subsequent deposition of the nonconductive barrier layer.

The metal layer 144 is etched down to form via plugs 160. The patterned passivation layer 460 acts a hard mask for the metal layer 144 etching process. The metal layer 144 etching process may comprise a wet etch. Conversely, a plasma-assisted dry etch may be used. The plasma-assisted dry etching comprises one or more of the following gases: fluorocarbon, fluorine-substituted hydrocarbon, fluorine, chlorine, hydrocarbon, nitrogen, hydrogen, oxygen, $BCl_3$, and argon. The etching process is timed such that the damascene interconnects 144 are only partially etched down. After the etch, via plugs 144 have been formed in an upper portion of the damascene interconnects 160. The remaining lower portion may now be called the conductive lines 156. Note that the via plugs 160 are formed from the same metal layer 144 as the conductive lines 156. Therefore, there is no possibility of the via plugs 160 being misaligned to the conductive lines 156.

For either wet or dry etching, the presence of the conductive barrier layer 140 and the passivation layer 460 prevent diffusion of metal ions, particularly copper, into the first dielectric layer 132 during the metal etch. The process of the present invention may then be completed as disclosed above in the first embodiment.

Figure 40:
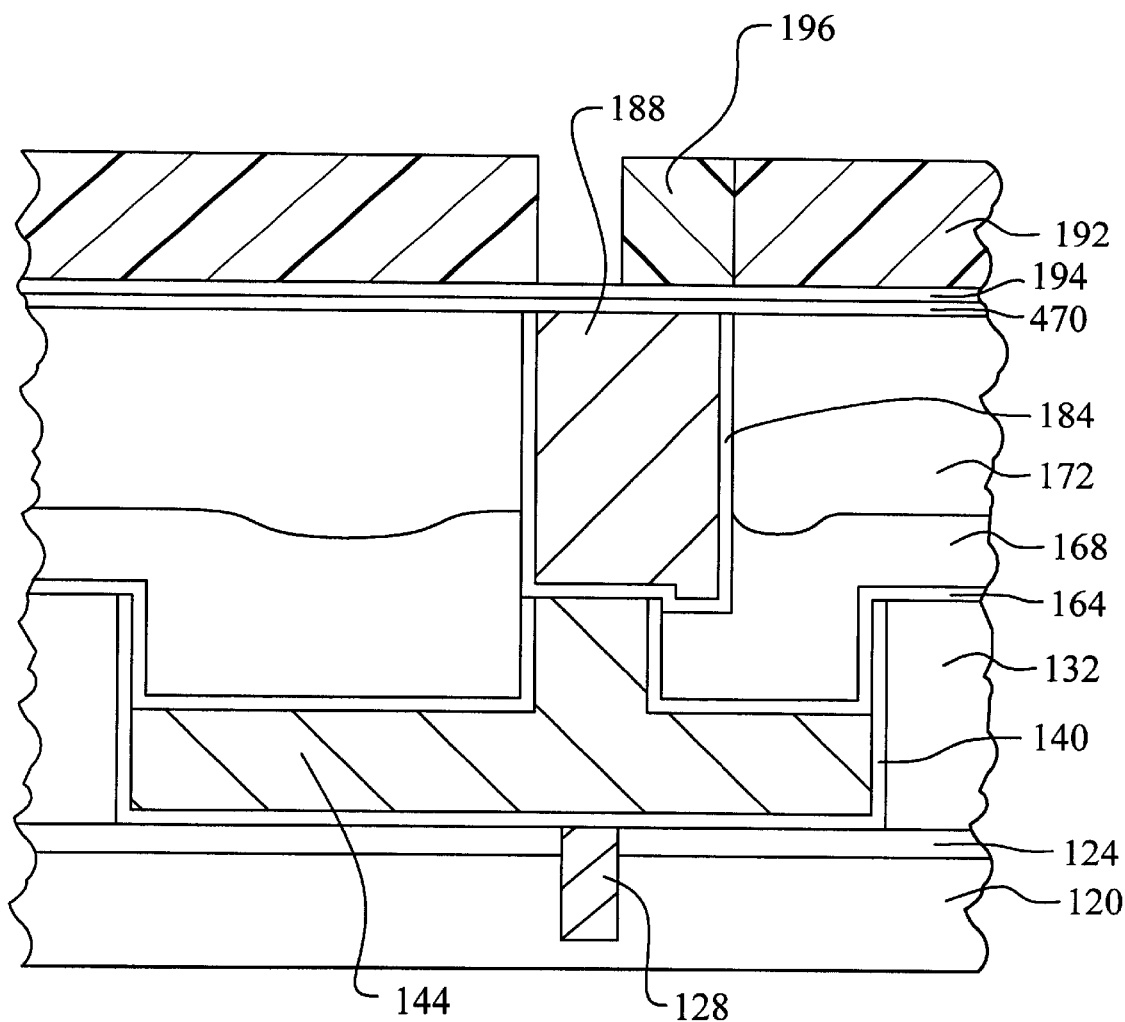
FIGS. 40 through 42 schematically illustrate in cross-sectional representation a ninth preferred embodiment of the present invention.

A ninth preferred embodiment of the present invention is now disclosed. A passivation layer is herein incorporated into the present invention to enhance the process capability during second-level metal layer etching into vias plugs and conductive lines for an upper level of interconnect and to act as a hard mask for the metal layer etching. Referring again to FIG. 10, the process of the first preferred embodiment is suspended after the second-level metal layer 188 and the second-level conductive barrier layer 184 are polished down to form damascene interconnects. Referring now particularly to FIG. 40, the ninth preferred embodiment initiates with the deposition of a passivation layer 470 overlying the second dielectric layer 172, the second-level metal layer 188 and the second-level conductive barrier layer 184. The passivation layer 470 comprises one of the group containing: silicon nitride, silicon carbide, silicon oxynitride, and BLok by Applied Materials Corporation. The passivation layer 470 is deposited to a thickness of between about 50 Angstroms and 3,000 Angstroms.

An organic bottom anti-reflective coating (BARC) layer 194, as disclosed above in the first embodiment, may optionally be applied overlying the passivation layer 470. A photoresist layer 192 and 196 is applied overlying the BARC layer 194. The photoresist layer 192 and 196 is exposed and developed as in the second level process of the first embodiment.

Figure 41:
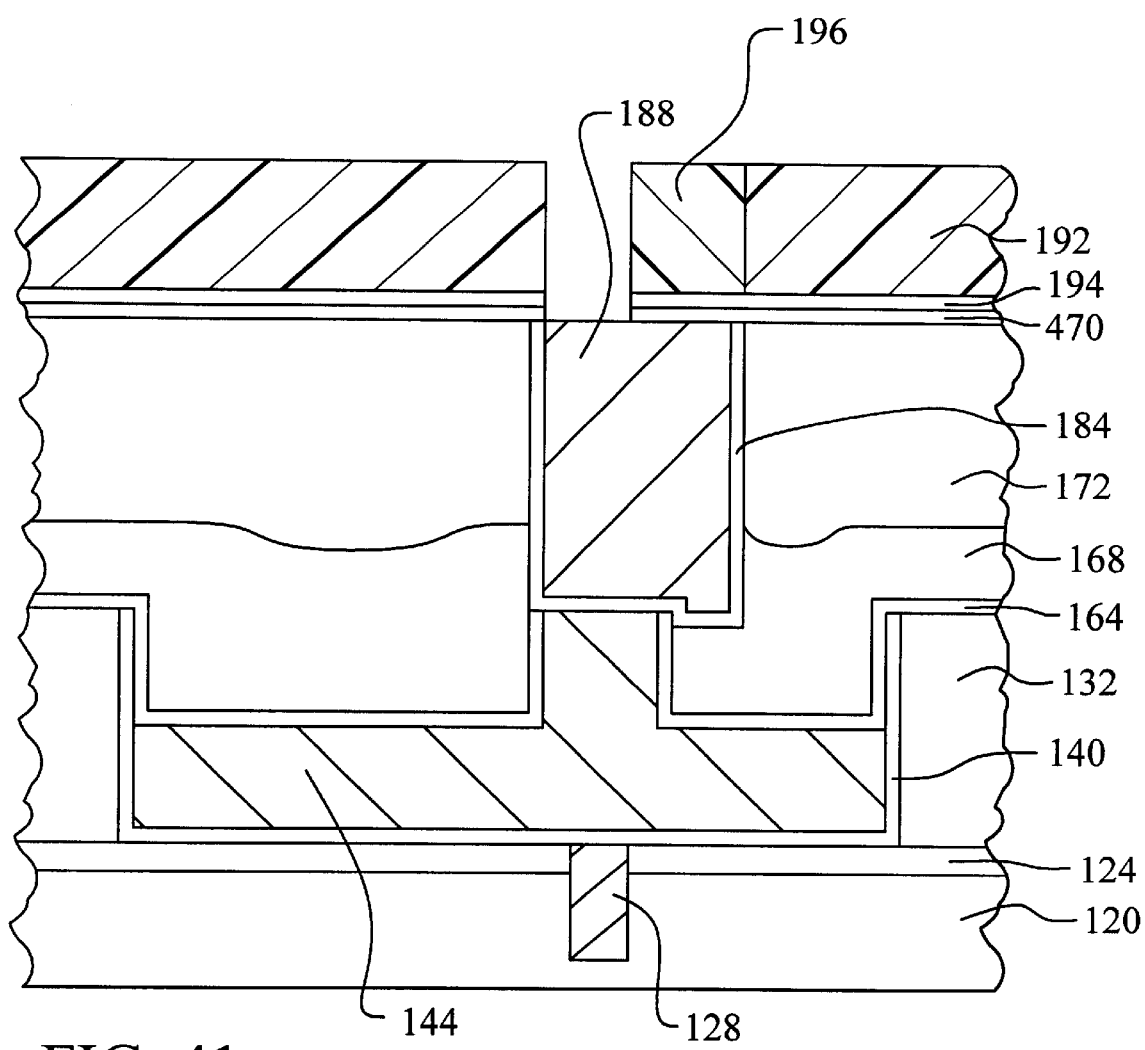

Referring now to FIG. 41, the BARC layer 194 and the passivation layer 470 are etched using a plasma-assisted dry etch. The plasma-assisted dry etch is performed using an etching chemistry comprising one or more of the following gases: fluorocarbon, fluorine-substituted hydrocarbon, fluorine, chlorine, hydrocarbon, nitrogen, hydrogen, oxygen, and argon. Note that the second-level metal layer 188 is not etched at this point.

Figure 42:
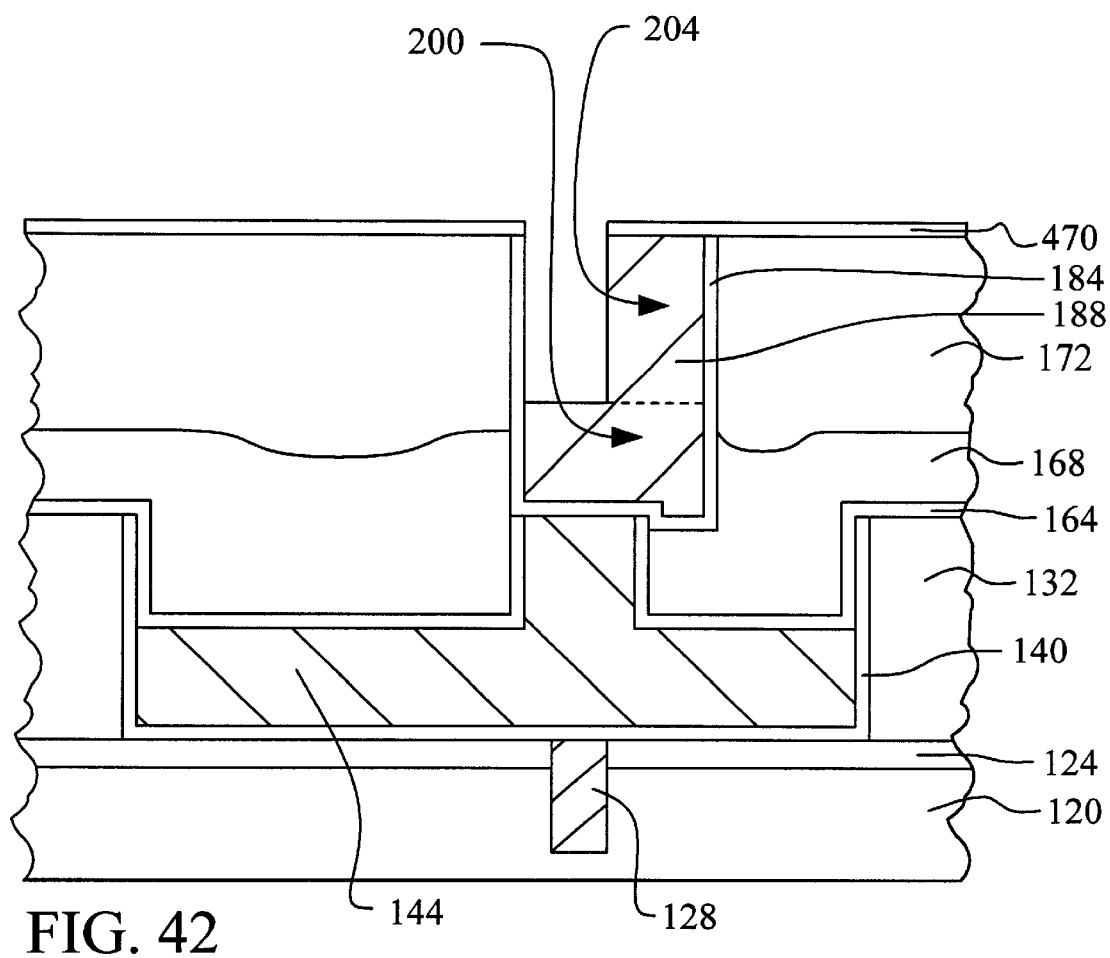

Referring now to FIG. 42, the photoresist layer 192 and 196 and the BARC layer 194 are removed. Solvent strippers are preferably used that are compatible with a copper metal layer. Oxygen ashing can also be used. However, a hydrogen or ammonia plasma treatment may become optional to remove the copper oxide prior to the subsequent deposition of the nonconductive barrier layer.

The second-level metal layer 188 is etched down to form via plugs 204. The etching process may be comprise a wet etch. Conversely, a plasma-assisted dry etch may be used. The plasma-assisted dry etching comprises one or more of the following gases: fluorocarbon, fluorine-substituted hydrocarbon, fluorine, chlorine, hydrocarbon, nitrogen, hydrogen, oxygen, $BCl_3$, and argon. The etching process is timed such that the damascene interconnects 188 are only partially etched down. After the etch, via plugs 204 have been formed in an upper portion of the damascene interconnects 188. The remaining lower portion may now be called the conductive lines 200. Note that the via plugs 204 are formed from the same metal layer 188 as the conductive lines 200. Therefore, there is no possibility of the via plugs 204 being misaligned to the conductive lines 200.

The presence of the passivation layer 470 prevents diffusion of metal ions, particularly copper, into the second dielectric layer 172 during the metal etch. The photoresist layer 192 and 196 and the BARC layer 194 are stripped away. Solvent strippers are preferably used that are compatible with a copper metal layer. Oxygen ashing can also be used. However, a hydrogen or ammonia plasma treatment may be needed to remove the copper oxide prior to the subsequent deposition of the nonconductive barrier layer. The process of the present invention may then be completed as disclosed above in the first embodiment.

For either wet or dry etching, the presence of the second-level conductive barrier layer 184 and the passivation layer 470 prevent diffusion of metal ions, particularly copper, into the second dielectric layer 168 and 172 during the metal etch. The process of the present invention may then be completed as disclosed above in the first embodiment.

As shown in the preferred embodiments, the present invention provides a very manufacturable process for forming metal interconnect levels in an integrated circuit device.

While the invention has been particularly shown and described with reference to the preferred embodiments thereof, it will be understood by those skilled in the art that various changes in form and details may be made without departing from the spirit and scope of the invention. Further, while this invention has been disclosed with reference to specific materials for insulating layers, dielectric layers, passivation layers, barrier layers and conductive metals, it will be understood by those skilled in the art of microelectronics and multilevel interconnects that it is not limited to such materials.

What is claimed is:

1. A method to form metal interconnect levels in the manufacture of an integrated circuit device comprising:

depositing a first dielectric layer overlying a semiconductor substrate wherein said semiconductor substrate comprises all layers and devices formed prior to said depositing of said first dielectric layer and wherein said first dielectric layer may comprise a stack of dielectric materials;

patterning said first dielectric layer to form trenches for planned damascene interconnects;

depositing an insulating layer overlying said first dielectric layer and lining said trenches;

anisotropically etching down said insulating layer to form insulating layer spacers on the sidewalls of said trenches wherein the presence of said insulating layer spacers prevents metal diffusion into said first dielectric layer;

depositing a conductive barrier layer overlying said first dielectric layer and lining said trenches;

depositing a metal layer overlying said conductive barrier layer and filling said trenches;

polishing down said metal layer and said conductive barrier layer to confine said metal layer and said conductive barrier layer to said trenches and to thereby said damascene interconnects;

patterning said damascene interconnects to form via plugs in an upper portion of said damascene interconnects wherein said patterning comprises partially etching down said damascene interconnects, wherein a via mask overlies and protects portions of said damascene interconnects from said etching down, wherein a trench mask overlies and protects said first dielectric layer from metal contamination during said etching down, and wherein portions of said damascene interconnects partially etched down form conductive lines;

depositing a nonconductive barrier layer overlying said first dielectric layer, said conductive lines, and said via plugs; and depositing a second dielectric layer overlying said nonconductive barrier layer and filling gaps caused by said patterning of said copper layer to complete said metal interconnect level in the manufacture of said integrated circuit device.

2. The method according to claim 1 wherein said first dielectric layer comprises one of the group of: undoped silicon dioxide (SiO2), fluorine-doped silicon dioxide, phosphorus-doped silicon dioxide, boron-doped silicon dioxide, phosphorus and boron-doped silicon dioxide, carbon-doped silicon dioxide, organic polymers, hydrogen-doped silicon dioxide, and porous combinations of any of the above materials.

3. The method according to claim 1 wherein said conductive barrier layer comprises one of the group of: titanium, titanium nitride, tantalum, tantalum nitride, tungsten nitride, ternary metal-silicon-nitride ($WSi_xN_y$), and ternary metal-boron-nitride ($WB_xN_y$), and combinations of any of the above mentioned materials.

4. The method according to claim 1 wherein said metal layer comprises one of the group of: copper, copper alloys, aluminum, and aluminum alloys.

5. The method according to claim 1 wherein said etching down of said damascene interconnects is by one of the group of: wet etching and plasma-assisted dry etching.

6. The method according to claim 1 wherein said nonconductive barrier layer comprises one of the group of: silicon nitride, silicon carbide, carbon nitride, boron nitride, carbon boron nitride, and silicon oxynitride.

7. The method according to claim 1 wherein said second dielectric layer comprises one of the group of: undoped silicon dioxide (SiO2), fluorine-doped silicon dioxide, phosphorus-doped silicon dioxide, boron-doped silicon dioxide, phosphorus and boron-doped silicon dioxide, carbon-doped silicon dioxide, organic polymers, hydrogen-doped silicon dioxide, and porous combinations of any of the above materials.

8. The method according to claim 1 further comprising depositing an etch stopping layer overlying said semiconductor substrate prior to said step of depositing said first dielectric layer.

9. The method according to claim 1 wherein said insulating layer comprises one of the group of: silicon nitride, silicon oxynitride, silicon carbide, and boron nitride.

10. The method according to claim 1 further comprising depositing a passivation layer overlying said damascene interconnects, said conductive barrier layer, and said first dielectric layer after said step of polishing down said metal layer and said barrier layer wherein the presence of said passivation layer overlying said first dielectric layer prevents metal diffusion into said first dielectric layer.

11. The method according to claim 10 wherein said passivation layer comprises one of the group containing: silicon nitride, silicon carbide, silicon oxynitride.

12. The method according to claim 10 further comprising patterning said passivation layer to form a hard mask wherein said hard mask is used in said step of patterning said damascene interconnects.

13. A method to form copper interconnect levels in the manufacture of an integrated circuit device comprising:

depositing a first dielectric layer overlying a semiconductor substrate wherein said semiconductor substrate comprises all layers and devices formed prior to said depositing of said first dielectric layer and wherein said first dielectric layer may comprise a stack of dielectric materials;

patterning said first dielectric layer to form trenches for planned damascene interconnects;

depositing an insulating layer overlying said first dielectric layer and lining said trenches;

anisotropically etching down said insulating layer to form insulating layer spacers on the sidewalls of said trenches wherein the presence of said insulating layer spacers prevents metal diffusion into said first dielectric layer;

depositing a conductive barrier layer overlying said first dielectric layer and lining said trenches;

depositing a copper layer overlying said conductive barrier layer and filling said trenches;

polishing down said copper layer and said conductive barrier layer to confine said copper layer and said conductive barrier layer to said trenches and to thereby form said damascene interconnects;

patterning said damascene interconnects to form via plugs in an upper portion of said damascene interconnects wherein said patterning comprises partially etching down said damascene interconnects, wherein a via mask overlies and protects portions of said damascene interconnects from said etching down, wherein a trench mask overlies and protects said first dielectric layer from copper contamination during said etching down, and wherein portions of said damascene interconnects partially etched down form conductive lines;

depositing a nonconductive barrier Layer overlying said first dielectric layer, said conductive lines, and said via plugs; and depositing a second dielectric layer overlying said nonconductive barrier layer and filling gaps caused by said patterning of said copper layer to complete said metal interconnect level in the manufacture of said integrated circuit device.

14. The method according to claim 13 wherein said first dielectric layer comprises one of the group of: undoped silicon dioxide (SiO2), fluorine-doped silicon dioxide, phosphorus-doped silicon dioxide, boron-doped silicon dioxide, phosphorus and boron-doped silicon dioxide, carbon-doped silicon dioxide, organic polymers, hydrogen-doped silicon dioxide, and porous combinations of any of the above materials.

15. The method according to claim 13 wherein said conductive barrier layer comprises one of the group of: titanium, titanium nitride, tantalum, tantalum nitride, tungsten nitride, ternary metal-silicon-nitride ($WSi_xN_y$), and ternary metal-boron-nitride ($WB_xN_y$), and combinations of any of the above mentioned materials.

16. The method according to claim 13 wherein said nonconductive barrier layer comprises one of the group of: silicon nitride, silicon carbide, carbon nitride, boron nitride, carbon boron nitride, and silicon oxynitride.

17. The method according to claim 13 further comprising depositing an etch stopping layer overlying said semiconductor substrate prior to said step of depositing said first dielectric layer.

18. The method according to claim 13 wherein said insulating layer comprises one of the group of: silicon nitride, silicon oxynitride, silicon carbide, and boron nitride.

19. The method according to claim 13 further comprising depositing a passivation layer overlying said damascene interconnects, said conductive barrier layer, and said first dielectric layer after said step of polishing down said copper layer and said barrier layer wherein the presence of said passivation layer overlying said first dielectric layer prevents copper diffusion into said first dielectric layer.

20. The method according to claim 19 wherein said passivation layer comprises one of the group containing: silicon nitride, silicon carbide, silicon oxynitride.

21. The method according to claim 19 further comprising patterning said passivation layer to form a hard mask wherein said hard mask is used in said step of patterning said damascene interconnects.

22. A method to form copper interconnect levels in the manufacture of an integrated circuit device comprising:

depositing a first dielectric layer overlying a semiconductor substrate wherein said semiconductor substrate comprises all layers and devices formed prior to said depositing of said first dielectric layer and wherein said first dielectric layer may comprise a stack of dielectric materials;

patterning said first dielectric layer to form trenches for planned damascene interconnects;

depositing an insulating layer overlying said first dielectric layer and lining said trenches;

anisotropically etching down said insulating layer to form insulating layer spacers on the sidewalls of said trenches;

depositing a conductive barrier layer overlying said first dielectric layer and said insulating layer spacer, and lining said trenches;

depositing a copper layer overlying said conductive barrier layer and filling said trenches;

polishing down said copper layer and said conductive barrier layer to confine said copper layer and said conductive barrier layer to said trenches and to thereby form said damascene interconnects;

depositing a passivation layer overlying said damascene interconnects, said conductive barrier layer, said insulating layer spacers, and said first dielectric layer wherein the presence of said passivation layer overlying said first dielectric layer prevents copper diffusion into said first dielectric layer;

patterning said damascene interconnects to form via plugs in an upper portion of said damascene interconnects wherein said patterning comprises etching through said passivation layer and partially etching down said damascene interconnects, wherein a via mask overlies and protects portions of said damascene interconnects from said etching down, wherein a trench mask overlies and protects said first dielectric layer from copper contamination during said etching down, wherein the presence of said insulating layer spacers prevents copper diffusion into said first dielectric layer, and wherein portions of said damascene interconnects partially etched down form conductive lines;

depositing a nonconductive barrier layer overlying said first dielectric layer, said conductive lines, and said via plugs; and depositing a second dielectric layer overlying said nonconductive barrier layer and filling gaps caused by said patterning of said copper layer to complete said metal interconnect level in the manufacture of said integrated circuit device.

23. The method according to claim 22 wherein said first dielectric layer comprises one of the group of: undoped silicon dioxide (SiO2), fluorine-doped silicon dioxide, phosphorus-doped silicon dioxide, boron-doped silicon dioxide, phosphorus and boron-doped silicon dioxide, carbon-doped silicon dioxide, organic polymers, hydrogen-doped silicon dioxide, and porous combinations of any of the above materials.

24. The method according to claim 22 wherein said conductive barrier layer comprises one of the group of: titanium, titanium nitride, tantalum, tantalum nitride, tungsten nitride, ternary metal-silicon-nitride ($WSi_xN_y$), and ternary metal-boron-nitride ($WB_xN_y$), and combinations of any of the above mentioned materials.

25. The method according to claim 22 wherein said nonconductive barrier layer comprises one of the group of: silicon nitride, silicon carbide, carbon nitride, boron nitride, carbon boron nitride, and silicon oxynitride.

26. The method according to claim 22 wherein said insulating layer comprises one of the group of: silicon nitride, silicon oxynitride, silicon carbide, and boron nitride.

27. The method according to claim 22 further comprising patterning said passivation layer to form a hard mask wherein said hard mask is used in said step of patterning said damascene interconnects.

28. A method to form copper interconnect levels in the manufacture of an integrated circuit device comprising:

depositing a first dielectric layer overlying a semiconductor substrate wherein said semiconductor substrate comprises all layers and devices-formed prior to said depositing of said first dielectric layer and wherein said first dielectric layer may comprise a stack of dielectric materials;

patterning said first dielectric layer to form trenches for planned damascene interconnects;

depositing a conductive barrier layer overlying said first dielectric layer and lining said trenches;

depositing a copper layer overlying said conductive barrier layer and filling said trenches;

polishing down said copper layer and said conductive barrier layer to confine said copper layer and said conductive barrier layer to said trenches and to thereby form said damascene interconnects;

depositing a passivation layer overlying said damascene interconnects, said conductive barrier layer, and said first dielectric layer after said step of polishing down said copper layer and said barrier layer;

patterning said passivation layer and said damascene interconnects to form via plugs in an upper portion of said damascene interconnects wherein said patterning comprises partially etching down said damascene interconnects, wherein a via mask overlies and protects portions of said damascene interconnects from said etching down, wherein a trench mask overlies and protects said first dielectric layer from copper contamination during said etching down, wherein the presence of said passivation layer overlying said first dielectric layer prevents copper diffusion into said first dielectric layer, and wherein portions of said damascene interconnects partially etched down form conductive lines;

depositing a nonconductive barrier layer overlying said first dielectric layer, said conductive lines, and said via plugs; and depositing a second dielectric layer overlying said nonconductive barrier layer and filling gaps caused by said patterning of said copper layer to complete said metal interconnect level in the manufacture of said integrated circuit device.

29. The method according to claim 28 wherein said first dielectric layer comprises one of the group of: undoped silicon dioxide (SiO2), fluorine-doped silicon dioxide, phosphorus-doped silicon dioxide, boron-doped silicon dioxide, phosphorus and boron-doped silicon dioxide, carbon-doped silicon dioxide, organic polymers, hydrogen-doped silicon dioxide, and porous combinations of any of the above materials.

30. The method according to claim 28 wherein said conductive barrier layer comprises one of the group of: titanium, titanium nitride, tantalum, tantalum nitride, tungsten nitride, ternary metal-silicon-nitride ($WSi_xN_y$), and ternary metal-boron-nitride ($WB_xN_y$), and combinations of any of the above mentioned materials.

31. The method according to claim 28 wherein said nonconductive barrier layer comprises one of the group of: silicon nitride, silicon carbide, carbon nitride, boron nitride, carbon boron nitride, and silicon oxynitride.

32. The method according to claim 28 further comprising:

depositing an insulating layer overlying said first dielectric layer and lining said trenches after said step of patterning said first dielectric layer to form trenches for planned damascene interconnects; and anisotropically etching down said insulating layer to form insulating layer spacers on the sidewalls of said trenches prior to said step of depositing a conductive barrier layer wherein the presence of said insulating layer spacers prevents copper diffusion into said first dielectric layer.

33. The method according to claim 28 wherein said passivation layer comprises one of the group containing: silicon nitride, silicon carbide, silicon oxynitride.

34. The method according to claim 28 further comprising patterning said passivation layer to form a hard mask wherein said hard mask is used in said step of patterning said damascene interconnects.

* * * * *